United States Patent
Hirler

(10) Patent No.: US 10,580,873 B2
(45) Date of Patent: Mar. 3, 2020

(54) POWER SEMICONDUCTOR DEVICE HAVING A FIELD ELECTRODE

(71) Applicant: Infineon Technologies Austria AG, Villach (AT)

(72) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/259,733

(22) Filed: Jan. 28, 2019

(65) Prior Publication Data

US 2019/0157402 A1    May 23, 2019

Related U.S. Application Data

(63) Continuation of application No. 15/651,126, filed on Jul. 17, 2017, now Pat. No. 10,204,993.

(30) Foreign Application Priority Data

Jul. 18, 2016    (DE) .................. 10 2016 113 183

(51) Int. Cl.
  *H01L 29/40*    (2006.01)
  *H01L 29/423*   (2006.01)
  *H01L 29/06*    (2006.01)
  *H01L 29/10*    (2006.01)
  (Continued)

(52) U.S. Cl.
  CPC ........ *H01L 29/407* (2013.01); *H01L 29/0619* (2013.01); *H01L 29/0634* (2013.01);
  (Continued)

(58) Field of Classification Search
  CPC . H01L 29/407; H01L 29/7813; H01L 29/158; H01L 29/0634; H01L 29/405;
  (Continued)

(56) References Cited

U.S. PATENT DOCUMENTS 10,090,265 B2 * 10/2018 Schneegans ............ H01L 24/05
10,236,351 B2 *  3/2019 Feil ....................... H01L 29/401
(Continued)

FOREIGN PATENT DOCUMENTS

DE    102014113375 A1    3/2016
DE    102016105424 A1   10/2016

*Primary Examiner* — Victor A Mandala
(74) *Attorney, Agent, or Firm* — Murphy, Bilak & Homiller, PLLC

(57) ABSTRACT

In an embodiment, a power semiconductor device includes: a semiconductor body for conducting a load current between first and second load terminals; source and channel regions and a drift volume in the semiconductor body; a semiconductor zone in the semiconductor body and coupling the drift volume to the second load terminal, a first transition established between the semiconductor zone and the drift volume; a control electrode insulated from the semiconductor body and the load terminals and configured to control a path of the load current in the channel region; and a trench extending into the drift volume along an extension direction and including a field electrode. A cross-sectional area of the field electrode is smaller than a cross-sectional area of the control electrode in a plane parallel to the extension direction.

21 Claims, 15 Drawing Sheets

(51) Int. Cl.
*H01L 29/15* (2006.01)
*H01L 29/739* (2006.01)
*H01L 29/78* (2006.01)
*H01L 29/861* (2006.01)

(52) U.S. Cl.
CPC ........ *H01L 29/1079* (2013.01); *H01L 29/157* (2013.01); *H01L 29/158* (2013.01); *H01L 29/404* (2013.01); *H01L 29/405* (2013.01); *H01L 29/4236* (2013.01); *H01L 29/4238* (2013.01); *H01L 29/42368* (2013.01); *H01L 29/7397* (2013.01); *H01L 29/7813* (2013.01); *H01L 29/0696* (2013.01); *H01L 29/8613* (2013.01)

(58) Field of Classification Search
CPC . H01L 29/0619; H01L 29/4238; H01L 29/29; H01L 29/7397; H01L 29/42368; H01L 29/157; H01L 29/404; H01L 29/4236; H01L 29/1079; H01L 29/8613; H01L 29/0696
See application file for complete search history.

(56) References Cited

U.S. PATENT DOCUMENTS

| | | | |
|---|---|---|---|
| 10,269,953 B2* | 4/2019 | Laforet | H01L 21/02164 |
| 10,283,634 B2* | 5/2019 | Haeberlen | H01L 29/0834 |
| 2009/0039419 A1* | 2/2009 | Zundel | H01L 29/0878 257/328 |
| 2013/0153995 A1* | 6/2013 | Misawa | H01L 29/407 257/330 |
| 2014/0073123 A1* | 3/2014 | Meiser | H01L 21/76877 438/586 |
| 2015/0076591 A1* | 3/2015 | Meyer | H01L 21/28008 257/330 |
| 2015/0236143 A1* | 8/2015 | Pfirsch | H01L 21/266 257/133 |
| 2016/0020315 A1* | 1/2016 | Hirler | H01L 29/0696 257/330 |
| 2016/0087005 A1* | 3/2016 | Philippou | H01L 27/2445 257/4 |

* cited by examiner

POWER SEMICONDUCTOR DEVICE HAVING A FIELD ELECTRODE

TECHNICAL FIELD

This specification refers to embodiments of a power semiconductor device, to embodiments of method of processing a power semiconductor device and to embodiments of a switched power circuit. In particular, this specification refers to embodiments of a power semiconductor device having a control electrode and a field electrode, and to corresponding embodiments of a processing method and to corresponding embodiments of a switched power circuit.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

For example, a power semiconductor device may comprise one or more Metal-Oxide-Semiconductor (MOS) control heads, wherein each control head may have at least one control electrode and a source region and a channel region arranged adjacent thereto. The control electrode is typically referred to as "gate electrode".

For setting the power semiconductor device into a conducting state, during which a load current in a forward direction may be conducted between load terminals of the device, the control electrode may be provided with a control signal having a voltage within a first range so as to induce a load current path within the channel region.

For setting the power semiconductor device into a blocking state, during which a forward voltage applied to the load terminals of the semiconductor device may be blocked and flow of the load current in the forward direction is inhibited, the control electrode may be provided with the control signal having a voltage within a second range different from the first range so as to cut off the load current path in the channel region. Then, the forward voltage may induce a depletion region at a junction formed by a transition between the channel region and a drift region of the power semiconductor device, wherein the depletion region is also called "space charge region" and may mainly expand into the drift region of the semiconductor device. In this context, the channel region is frequently also referred to as a "body region", in which said load current path, e.g., an inversion channel, may be induced by the control electrode to set the semiconductor device in the conducting state. Without the load current path in the channel region, the channel region may form a blocking junction with the drift region.

It is a general aim to keep losses occurring at semiconductor devices low, wherein said losses essentially are caused by conducting losses and/or switching losses, such that said application, e.g., said power supply or power converter, may exhibit a high efficiency. To this end, compensation structures, which are also referred to as "superjunction structures", have been proposed.

Beyond a control electrode, a power semiconductor device may further comprise a field electrode which may be electrically connected to one of the load terminals and which may extend into the drift region towards the other load terminal. Presence of the field electrode in the power semiconductor device may have an influence on the capacity formed by the load terminals. Said capacity is also referred to as CDs in some cases.

Further, the capacity CDs and/or a capacity formed between the control electrode and one of the load terminals, also referred to as CDG in some cases, may effect a degree of voltage and/or current oscillation during a switching procedure.

SUMMARY

According to an embodiment, a power semiconductor device comprises a semiconductor body configured to conduct a load current between a first load terminal and a second load terminal of the power semiconductor device; a source region, a channel region and a drift volume, each included in the semiconductor body, the source region being electrically connected to the first load terminal and the channel region isolating the source region from the drift volume; a semiconductor zone included in the semiconductor body and coupling the drift volume to the second load terminal, a first transition being established between the semiconductor zone and the drift volume; a control electrode insulated from each of the semiconductor body and the load terminals and configured to control a path of the load current in the channel region; and a trench extending into the drift volume along an extension direction and including a field electrode. An ohmic resistance of the field electrode is greater than an ohmic resistance of the control electrode. Further, a distance between the field electrode and the first transition is at least 70% of the total extension of the drift volume in the extension direction.

According to a further embodiment, a power semiconductor device comprises a semiconductor body configured to conduct a load current between a first load terminal and a second load terminal of the power semiconductor device; a source region, a channel region and a drift volume, each included in the semiconductor body, the source region being electrically connected to the first load terminal and the channel region isolating the source region from the drift volume, wherein at least a total extension of the drift volume along an extension direction defines a blocking voltage of the semiconductor device; a control electrode insulated from each of the semiconductor body and the load terminals and configured to control a path of the load current in the channel region; and a trench extending into the drift volume along the extension direction and including a field electrode isolated from the drift volume by a field insulator. An ohmic resistance of the field electrode is greater than an ohmic resistance of the control electrode. Further, at least one of a first thickness of the field insulator along a first lateral direction and a second thickness of the field insulator along the extension direction is less than the blocking voltage multiplied with a factor of 2 nm/V.

According to a yet further embodiment, a switched power device is configured to receive an input power signal comprising at least one of an input voltage and an input current. The switched power device comprises a circuit arrangement including at least one power semiconductor device in accordance with one of the aforementioned embodiments. The circuit arrangement is configured to convert the input power signal into an output power signal comprising at least one of an output voltage and an output current, the output power signal being different from the input power signal; and the switched power device is configured to provide the output power signal to an electric load.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
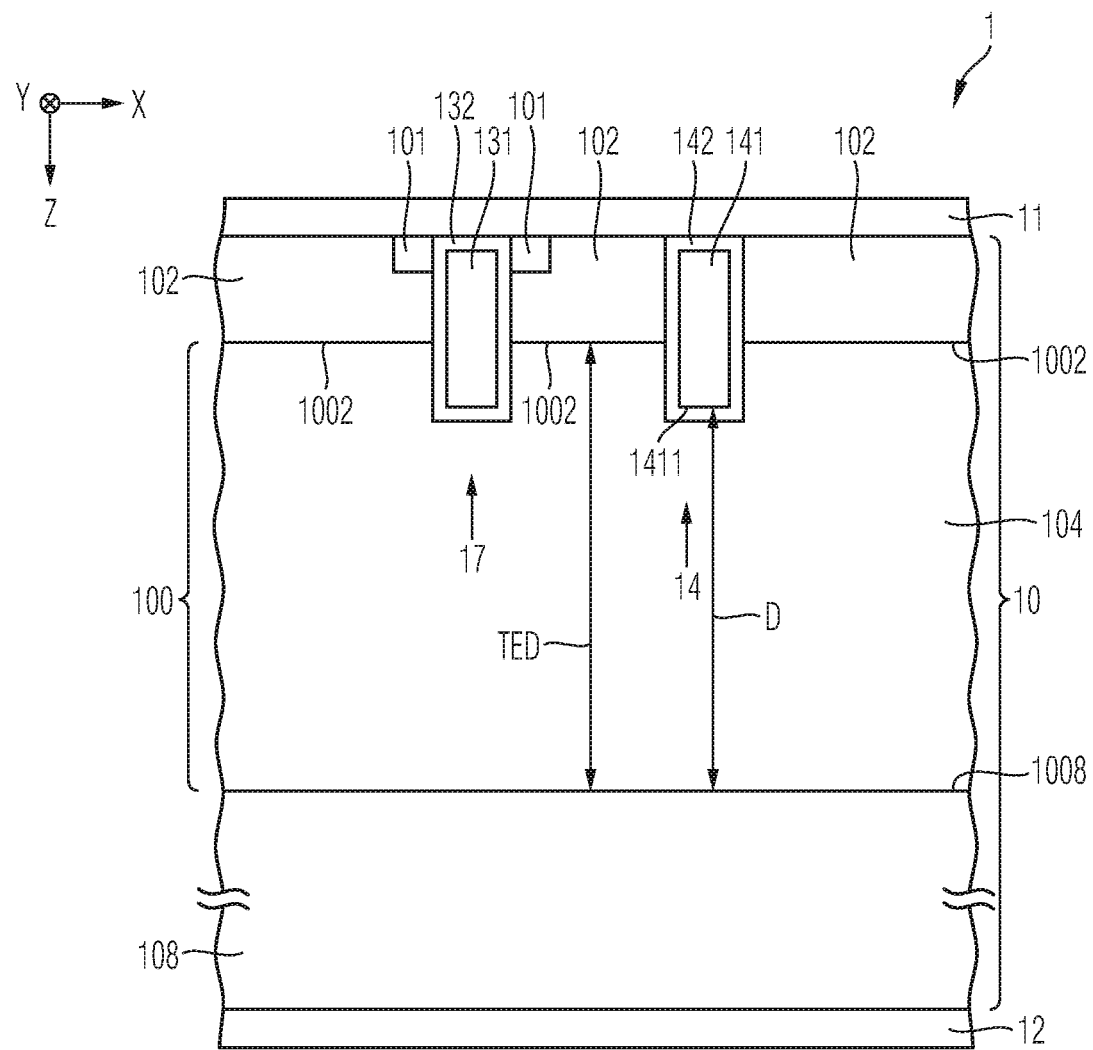
FIG. 1 schematically illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, such as a power semiconductor transistor, that may be used within a switched power device, e.g., a power converter or a power supply. Thus, in an embodiment, the semiconductor device is configured to carry a load current that is to be fed to a load and/or, respectively, that is provided by a power source. For example, the power semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 300 V, e.g., up to at least 400 V, e.g., greater than 1 kV, or even greater than 3 kV. For example, the power semiconductor device described below may be a semiconductor device exhibiting a stripe configuration or a cellular configuration and can be configured to be employed as a power component in a medium- and/or high voltage application. Occasionally, the power semiconductor device will also be referred to as simply "semiconductor device".

FIG. 1 schematically illustrates a section of a vertical cross-section of a power semiconductor device 1 in accordance with one or more embodiments. The illustrated cross-section is in parallel to a plane defined by the extension direction Z and the first lateral direction X. Each of the components depicted therein may extend into the second lateral direction Y.

The embodiment of the semiconductor device 1 illustrated in FIG. 1 comprises a semiconductor body 10 configured to conduct a load current between a first load terminal 11 and a second load terminal 12 of the power semiconductor device 1. Each of a source region 101, a channel region 102 and a drift volume 100 are included in the semiconductor body 10. The source region 101 can be electrically connected to the first load terminal 11, and the channel region 102, which can also be electrically connected to the first load terminal 11, may isolate the source region 101 from the drift volume 100.

A semiconductor zone 108 comprising, e.g., a collector region or a drain region, may be included in the semiconductor body 10 and may couple the drift volume 100 to the second load terminal 12. A first transition 1008 can be established between the semiconductor zone 108 and the drift volume 100. The first transition 1008 may be the lower end of a space charge region established during a blocking state of the semiconductor device 1, in accordance with an embodiment. For example, the semiconductor zone 108 may be provided by means of a substrate material and/or by means of carrying out an implantation processing step, e.g., from a backside of the semiconductor device 1. For example, at least a section of the semiconductor zone 108 exhibits a dopant concentration amounting to at least 10 times of the dopant concentration of the drift volume 100. Said factor may be even higher than 10; e.g., the factor may be greater than 100, or even greater than 1000. Depending on the configuration of the power semiconductor device 1, the semiconductor zone 108 may comprise a drain region and/or a p-doped emitter (collector) region, e.g., arranged in electrical contact with the second load terminal 12. Further, in order to provide for a reverse load current capability, the semiconductor zone 108 may comprise highly doped regions, e.g., $n^+$-regions, which also referred to as "n-shorts", and which may be electrically connected to the second load terminal 12. Further, the semiconductor zone 108 may also comprise a field stop layer or a buffer layer. These exemplary and optional components of the semiconductor zone 108 have not been illustrated in the drawings.

Further, a control electrode 131 insulated from each of the semiconductor body 10 and the load terminals 11, 12 can be configured to control a path of the load current in the channel region 102. A trench 14 that extends into the drift volume 100 along the extension direction Z may include a field electrode 141. In an embodiment, an ohmic resistance (cf. e.g. $R_{FP}$ in FIG. 9) of the field electrode 141 is greater than an ohmic resistance (cf. e.g. $R_G$ in FIG. 9) of the control electrode 131. Further, a distance D between the field electrode 141 and the first transition 1008 may amount to at least 70% of the total extension TED of the drift volume 100 in the extension direction Z. This distance can be even greater than 70%, e.g., greater than 80%, greater than 90% or even greater than 95%.

Figure 2:
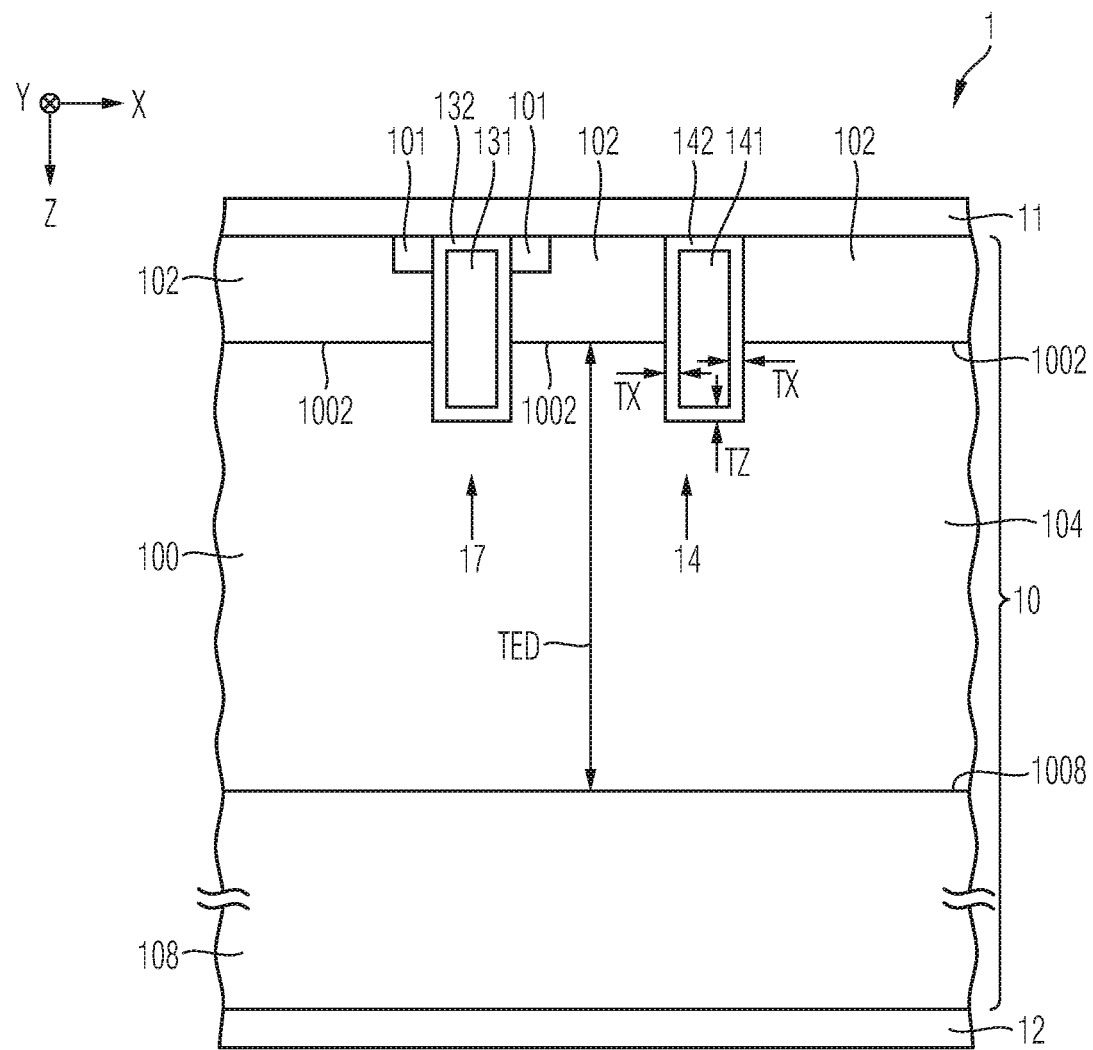
FIG. 2 schematically illustrates a section of a vertical cross-section of a power semiconductor device in accordance with one or more embodiments.

FIG. 2 schematically illustrates a section of a vertical cross-section of a power semiconductor device 1 in accordance with one or more further embodiments. The illustrated cross-section is in parallel to a plane defined by the extension direction Z and the first lateral direction X. Each of the components depicted therein may extend into the second lateral direction Y.

The embodiment of the semiconductor device 1 illustrated in FIG. 2 comprises a semiconductor body 10 configured to conduct a load current between a first load terminal 11 and a second load terminal 12 of the power semiconductor device 1. Each of a source region 101, a channel region 102 and a drift volume 100 are included in the semiconductor body 10. The source region 101 can be electrically connected to the first load terminal 11, and the channel region 102, which can also be electrically connected to the first load terminal 11, may isolate the source region 101 from the drift volume 100. For example, at least a total extension TED of the drift volume 100 along the extension direction Z defines a blocking voltage of the semiconductor device 1. Further, a control electrode 131 insulated from each of the semiconductor body 10 and the load terminals 11, 12 can be configured to control a path of the load current in the channel region 102. A trench 14 that extends into the drift volume 100 along the extension direction Z may include a field electrode 141 isolated from the drift volume 100 by a field insulator 142. In an embodiment, an ohmic resistance (cf. e.g. $R_{FP}$ in FIG. 9) of the field electrode 141 is greater than an ohmic resistance (cf. e.g. $R_G$ in FIG. 9) of the control electrode 131. Further, at least one of a first thickness TX of the field insulator 142 along the first lateral direction X and a second thickness TZ of the field insulator 142 along the extension direction Z is less than the blocking voltage multiplied with a factor of 2 nm/V.

In accordance with the embodiments schematically and exemplarily illustrated in FIGS. 1 and 2, the control electrode 131 may be arranged in a trench 17 and may be electrically insulated from each of the semiconductor body 10 and the first load terminal 11 by an insulator 132. It shall be understood, however, that in accordance with other embodiments, the control electrode 131 may exhibit a planar configuration and may be arranged above the semiconductor body 10. Further, as will be explained with respect to other drawings, the field electrode 141 and the control electrode 131 must not necessarily be arranged in separate trenches 14 and 17, but may also be arranged in a shared trench.

For example, compared to low voltage field effect transistors (FET), the field electrode 141 in accordance with one or more embodiments of the semiconductor device 1 may be positioned comparatively far away from the first transition 1008. For example, due to the comparatively large distance D, the thickness of the field insulator 142 can be comparatively small. In contrast, regarding a low voltage FET, a field electrode may there traverse substantially the entire drift volume and may even extend into a substrate region. Presently, the inventor has recognized that even though a capacity formed by the field electrode 141 and the second load terminal 12 can be comparatively low, a dampening effect of the field electrode 141 due to its ohmic configuration can be significant.

Figure 3:
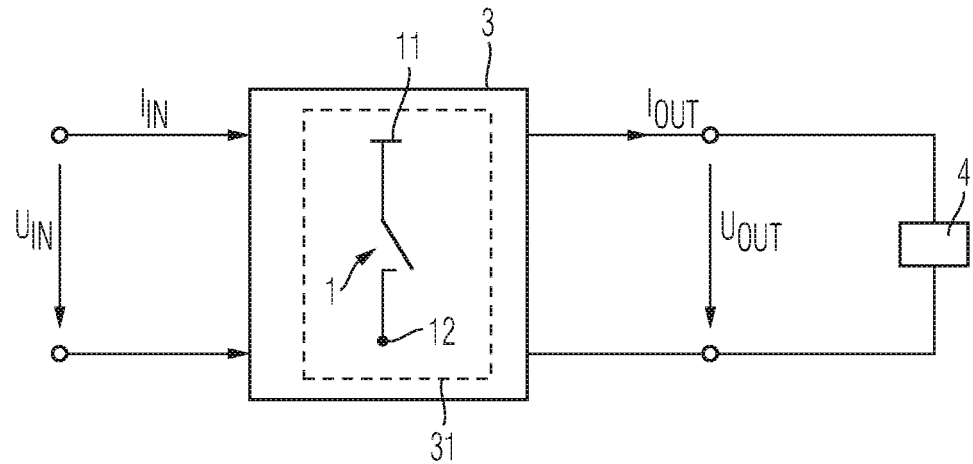
FIG. 3 schematically illustrates a block diagram of a switched power device in accordance with one or more embodiments.

FIG. 3 schematically illustrates a block diagram of a switched power device 3. The switched power device 3 may be configured to receive an input power signal comprising at least one of an input voltage $U_{IN}$ and an input current $I_{IN}$. The switched power device 3 may comprises a circuit arrangement 31 including at least one power semiconductor device 1, e.g., a power semiconductor device 1 in accordance with one of the embodiments schematically illustrated in FIG. 1 and FIG. 2. The circuit arrangement 31, e.g., a switched power supply circuit or a switched drive circuit, can be configured to convert the input power signal into an output power signal comprising at least one of an output voltage $U_{OUT}$ and an output current $I_{OUT}$. The output power signal can be different from the input power signal; e.g., it may differ in amplitude, frequency, phase and/or shape. Further, the switched power device 3 can be configured to provide the output power signal to an electric load 4. For example, the input power signal may comprise a DC voltage and the circuit arrangement 31 may be configured to convert the DC voltage into an AC voltage, e.g., so as to drive an electric motor. In other words, the load 4 may comprise an electric motor. In another embodiment, the load 4 may comprise a section of the electric grid and the circuit arrangement 31 may be configured to receive an AC voltage and/or an AC current as the input power signal and may be configured to convert this input AC signal into an output AC signal. To this end, the circuit arrangement 31 may comprise a plurality of power semiconductor devices 1 which may be arranged, e.g., in a DC/DC, in a DC/AC, in a AC/DC and/or in a AC/AC configuration. Just to give a few examples, the circuit arrangement 31 may comprise at least one of a buck converter, a boost converter, a buck/boost converter, a LLC converter, a ZVS (Zero Voltage Switching) bridge, a PFC (power factor compensation) device, a rectifier, and a converter, e.g., a converter in bridge arrangement.

Figure 4:
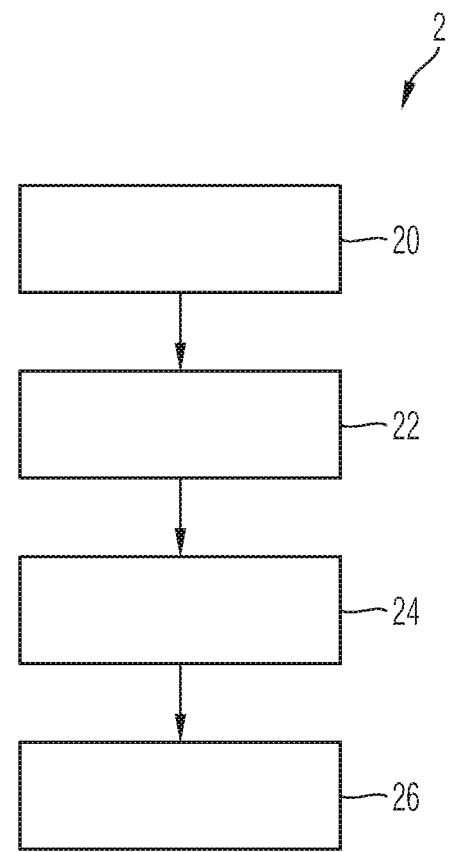
FIG. 4 schematically illustrates a diagram of a power semiconductor device processing method in accordance with one or more embodiments.

FIG. 4 schematically and exemplarily illustrates a diagram of a method 2 of processing a power semiconductor device in accordance with one or more embodiments. In the following, it also referred to FIG. 1. For example, in a step 20, a power semiconductor device 1 is provided that comprises a semiconductor body 10 configured to conduct a load current between a first load terminal 11 and a second load terminal 12 of the power semiconductor device 1. Each of a source region 101, a channel region 102 and a drift volume 100 are included in the provided semiconductor body 10. Further, the semiconductor device 1 can be provided such that the source region 101 is electrically connected to the first load terminal 11 and such that the channel region 102 isolates the source region 101 from the drift volume 100. The provided semiconductor device 1 may comprise a semiconductor zone 108 including, e.g., a collector region or a drain region, which may be integrated in the semiconductor body 10 and may couple the drift volume 100 to the second load terminal 12. A first transition 1008 can be established between the semiconductor zone 108 and the drift volume 100. Further, in a step 22, there may be provided a control electrode 131 insulated from each of the semiconductor body 10 and the load terminals 11, 12. The control electrode 131 may be provided such that it is configured to control a path of the load current in the channel region 102. In step 24, a trench 14 may be provided that extends into the drift volume 100 along the extension direction Z and that includes a field electrode 141. In an embodiment of the method 2, in step 26, it is ensured that an ohmic resistance (cf. e.g. $R_{FP}$ in FIG. 9) of the field electrode 141 is greater than an ohmic resistance (cf. e.g. $R_G$ in FIG. 9) of the control electrode 131. Further, step 24 can be carried out such that a distance D between the field electrode 141 and the first transition 1008 is at least 70% of the total extension TED of the drift volume 100 in the extension direction Z.

Figure 5:
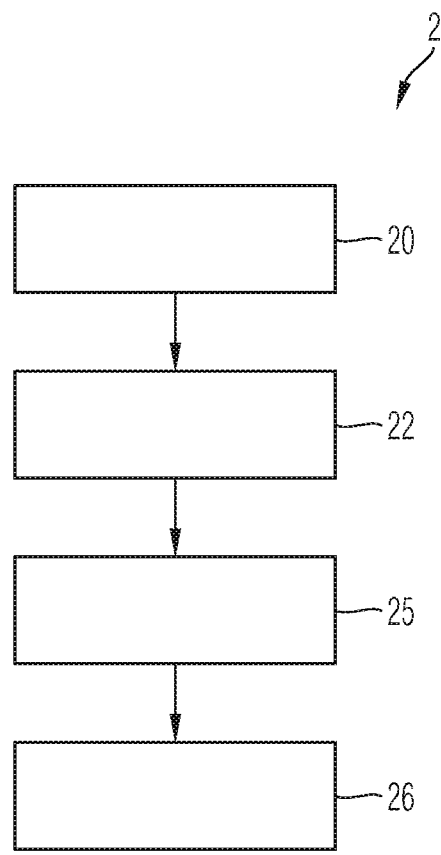
FIG. 5 schematically illustrates a diagram of a power semiconductor device processing method in accordance with one or more embodiments.

FIG. 5 schematically and exemplarily illustrates a diagram of a method 2 of processing a power semiconductor device in accordance with one or more embodiments. In the following, it also referred to FIG. 2. For example, in a step 20, a power semiconductor device 1 is provided that comprises a semiconductor body 10 configured to conduct a load current between a first load terminal 11 and a second load terminal 12 of the power semiconductor device 1. Each of a source region 101, a channel region 102 and a drift volume 100 can be included in the provided semiconductor body 10. Further, the semiconductor device 1 can be provided such that the source region 101 is electrically connected to the first load terminal 11 and such that the channel region 102 isolates the source region 101 from the drift volume 100. For example, at least a total extension TED of the drift volume 100 along the extension direction Z defines a blocking voltage of the semiconductor device 1. Further, in step 22, there may be provided a control electrode 131 insulated from each of the semiconductor body 10 and the load terminals 11, 12. The control electrode 131 may be provided such that it is configured to control a path of the load current in the channel region 102. In step 25, a trench 14 may be provided that extends into the drift volume 100 along the extension direction Z and that includes a field electrode 141 isolated from the drift volume 100 by a field insulator 142. In an embodiment of the method 2, in step 26, it is ensured that an ohmic resistance (cf. e.g. $R_{FP}$ in FIG. 9) of the field electrode 141 is greater than an ohmic resistance (cf. e.g. $R_G$ in FIG. 9) of the control electrode 131. Further, step 25 can be carried out such that at least one of a first thickness TX of the field insulator 142 along the first lateral direction X and a second thickness TZ of the field insulator 142 along the extension direction Z is less than the blocking voltage multiplied with a factor of 2 nm/V.

For example, the power semiconductor device 1, e.g. in accordance with the embodiment illustrated in FIG. 1 or in FIG. 2, is configured for a blocking voltage of at least 300 V. Said blocking voltage can be greater than 300 V, e.g., greater than 500 V, greater than 750 V or even greater than 1 kV or more than 3 kV. As explained above, for configuring the semiconductor device such that it exhibits such blocking voltage, the total extension TED of the drift volume 100 along the extension direction Z may be accordingly chosen.

In the following, features of further embodiments of the power semiconductor device 1 as illustrated in FIG. 1 and FIG. 2 shall be explained. If not explicitly stated otherwise, each of the optional features mentioned hereinafter may equally apply to the embodiments as illustrated in each of FIG. 1 to FIG. 5, i.e., also to the embodiments of the method 2 and to the embodiments of the switched power device 3.

In an embodiment, said distance D (cf. FIG. 1) may be even greater than 70% of the total extension TED of the drift volume 100, e.g., greater than 75%, greater than 80% or even greater than 90%.

Further, at least one of said first thickness TX of the field insulator 142 along the first lateral direction X and said second thickness TZ of the field insulator 142 along the extension direction Z may amount to even less than the blocking voltage multiplied with a factor of 2 nm/V. For example, said factor may amount to 1 nm/V, to 0.75 nm/V or to less than 0.5 nm/V. For example, if the power semiconductor device 1, e.g., the total extension TED of the drift volume 100, is designed for a blocking voltage of 500 Volts, at least one of the first thickness TX and the second thickness TZ may amount to less than 1000 nm, or to even less than 500 nm in accordance with an embodiment.

The ohmic field electrode resistance $R_{FP}$ may be configured to dampen a ringing, e.g., by reducing at least one of a current oscillation and a voltage oscillation in amplitude and/or in duration. Such oscillations may become into being during switching procedures, e.g., during turn-on and/or during turn-off. In accordance with an embodiment, the ringing is dampened, e.g., in amplitude and/or in duration, due to presence of the ohmic field electrode resistance $R_{FP}$ that is greater than the ohmic control electrode resistance $R_G$.

For example, the ohmic field electrode resistance $R_{FP}$ may amount to at least 110% of the ohmic control electrode resistance $R_G$. This ratio can be even greater than 110%, e.g., greater than 150%, greater than 200%, or even greater than 300%.

In an embodiment, the ohmic field electrode resistance $R_{FP}$ is at least 1Ω, to at least 2Ω, to at least 2.5Ω or to even more than 3Ω.

In the following, some exemplary possibilities of realizing an ohmic field electrode resistance $R_{FP}$ that is greater than ohmic control electrode resistance $R_G$ shall be explained. Further, it will be explained how the notions "ohmic field electrode resistance $R_{FP}$" and "ohmic control electrode resistance $R_G$" as used in this specification can be understood.

Figure 6:
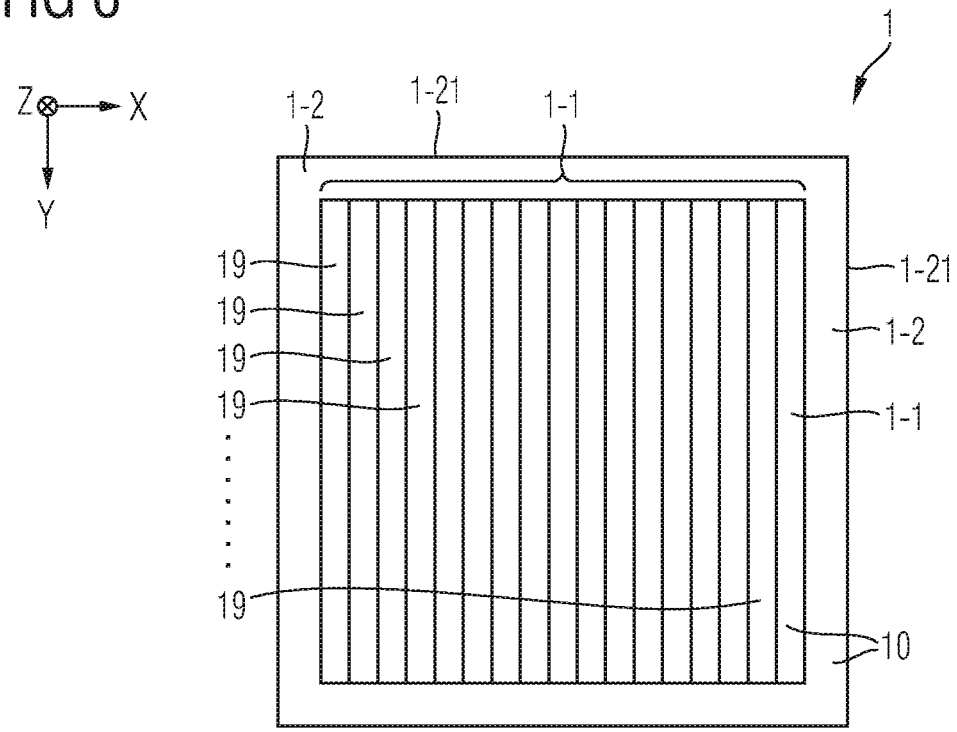
FIGS. 6-7 each schematically illustrate a section of a horizontal projection of a power semiconductor device in accordance with one or more embodiments.
Figure 7:
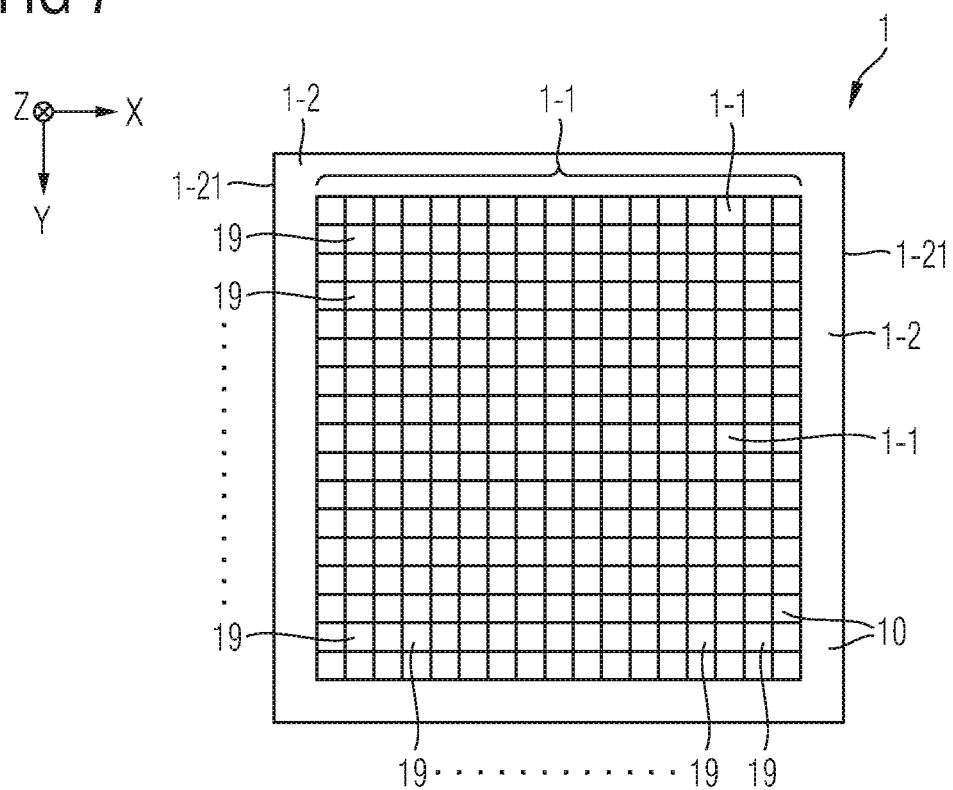

Regarding FIG. 6 and FIG. 7 in the first instance, the power semiconductor device 1 may comprise an active region 1-1 that is surrounded by a non-active edge region 1-2. The non-active edge region 1-2 may be terminated by an edge 1-21, which may have become into being, e.g., by separating a die from a wafer along a dicing line.

For example, a plurality of power cells 19 which may each be configured to conduct a part of the load current between the first load terminal 11 and the second load terminal 12 may be arranged in the active region 1-1. For example, as illustrated in FIG. 6, the power cells 19 may exhibit a stripe configuration, wherein each stripe cell may traverse at least a substantial part of the active region 1-1. In another example, as illustrated in FIG. 7, the power cells 19 may exhibit a cellular configuration, wherein a total lateral extension of each cellular cell is only a fraction of the lateral extension of the active region 1-1. Speaking generally, the skilled person is acquainted with the differences between a stripe configuration and a cellular configuration (e.g., cells with a rectangular horizontal cross-section, a quadratic cross-section, a hexagonal cross-section or a circular/elliptical cross-section), and within the present specification, it is not deviated from this common understanding of these notions. For example, in case of a cellular configuration (as illustrated in FIG. 7), the control electrodes 131 may be formed by a contiguous grid. Also the field electrodes 141, which may be arranged in the same trenches as the control electrodes 131, may be formed by a contiguous grid. Further, it shall be understood that a power semiconductor chip including the power semiconductor device 1 as described herein may comprise several active regions 1-1. In between such active regions 1-1, there may be arranged edge termination zones and, e.g., on top thereof, a number of first contact runners for contacting the field electrodes 141 and/or a number of second contact runners for contacting the control electrodes 131. By means of these contact runners and the manner of how these contact the control electrodes or, respectively, the field electrodes 141, the ohmic resistances associated with the control electrodes 131 and/or the field electrodes 141 may be controlled, in accordance with an embodiment.

Irrespective of the chosen configuration, each power cell 19 may comprise a section of the source region 101, section of the channel region 102 and a section of the drift volume 100. Further, each power cell 19 may be controlled by means of respective control electrode 131. In between two adjacent power cells 19, they are may be arranged one or more of said trenches 14, each trench including the field electrode 141. These trenches 14 are not illustrated in FIGS. 6 and 7. For example, referring to FIG. 6, the one or more trenches 14 that may be arranged between each two adjacent power cells 19, may also exhibit a stripe configuration with similar or equal lateral dimensions as the power cells 19 (cf. e.g., FIG. 12 or FIG. 13). Referring to FIG. 7, the one or more trenches 14 that may be arranged between each two adjacent power cells 19, may also exhibit a cellular configuration with similar or equal lateral dimensions as the power cells 19. Correspondingly, also the control electrodes 131 and the field electrodes may exhibit a stripe configuration or a cellular configuration.

Thus, it shall be understood that in the event the power semiconductor device 1 comprises more than one field electrode 141 and/or more than one control electrode 131, the notion "ohmic field electrode resistance $R_{FP}$" may refer to the ohmic field electrode resistance $R_{FP}$ of all field electrodes 141 that are included in the power semiconductor device 1 and that, correspondingly, the notion "ohmic control electrode resistance $R_G$" may refer to the ohmic control electrode resistance $R_G$ of all control electrodes 131 that are included in the power semiconductor device 1. For example, a plurality of said field electrodes 141 and a plurality of said control electrodes 131 are arranged in the active region 1-1, wherein the ohmic resistance $R_{FP}$ of the plurality of field electrodes 141 is at least 110% of the ohmic resistance $R_G$ of the plurality of control electrodes 131. This factor can be greater than 110%, as has been explained above.

For example, an electric conductivity of the field electrode(s) 141 is smaller as compared to the electric conductivity of the control electrode(s) 131. Irrespective of the chosen spatial configuration of the control electrode 131 and the field electrode 141, the difference between the ohmic control electrode resistance $R_G$ and the ohmic field electrode resistance $R_{FP}$ may be achieved by a difference in the material. For example, the control electrode 131 can be made of a first material and the field electrode 141 can be made of a second material. The second material can exhibit an electric conductivity smaller than the electric conductivity of the first material. Each of the first material and the second material can be composite materials, e.g., material stacks. For example, the first material of the control electrode 131 can be a poly doped semiconductor material, and also the second material of the field electrode 141 can be a poly doped semiconductor material, wherein the dopant concentration present in the second material can be lower as compared to the dopant concentration present in the first material.

Figure 8:
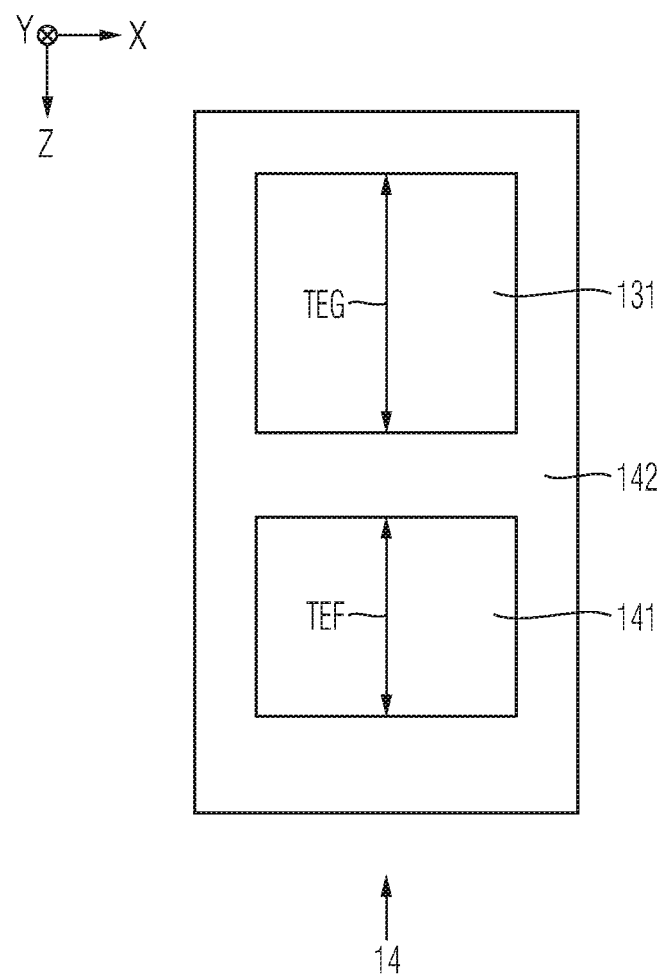
FIG. 8 schematically illustrates a section of a vertical cross-section of a trench of a power semiconductor device in accordance with one or more embodiments.

Now referring to FIG. 8, the difference between the ohmic control electrode resistance $R_G$ and the ohmic field electrode resistance $R_{FP}$ may alternatively or additionally be achieved by a difference in geometry. For example, a cross-sectional area of the field electrode 141 can be smaller as compared to a cross-sectional area of the control electrode 131, each of said cross-sectional areas being in parallel to the plane defined by the first lateral direction X and the extension direction Z. In an embodiment, the cross-sectional area of the control electrode 131 is the cross-sectional area of the field electrode multiplied with a factor greater than 1.1, greater than 1.5 or even with a factor greater than 2. Further, a total extension TEF of the field electrode 141 may be smaller as compared to a total extension TEG of the control electrode 131, each of said total extensions TEF and TEG being parallel to the extension direction Z. For example, the total extension TEG is the total extension TEF multiplied with a factor greater than 1.1, greater than 1.5 or even with a factor greater than 2. For example, between the control electrode 131 and the field electrode 141, there may be arranged a further electrode (not illustrated), e.g., a shield electrode, wherein said further electrode may be electrically connected to the potential of the first load terminal 11, which may be a source potential.

As schematically illustrated in FIG. 8, both the control electrode 131 and the field electrode 141 may be arranged in the same trench 14, wherein the field electrode 141 can be arranged below the control electrode 131. This optional aspect will be elucidated in more detail with respect to FIG. 14. If the trench 14 includes both the control electrode 131 and the field electrodes 141, both electrodes 131 and 141 may be isolated from the semiconductor body 10 by means of the field insulator 142. The field insulator 142 may be comprise a field oxide and/or a gate oxide.

Figure 9:
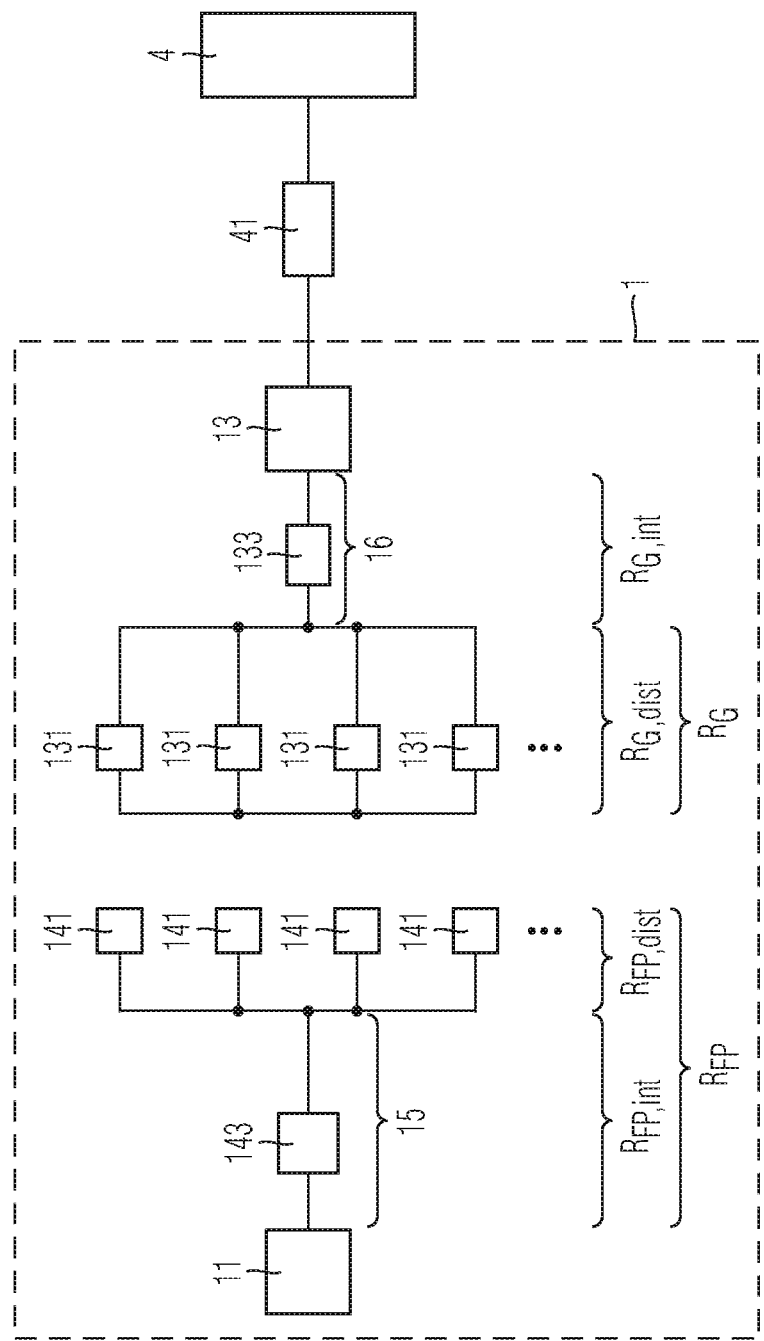
FIG. 9 schematically illustrates ohmic resistances associated with a field electrode and a control electrode of a power semiconductor device in accordance with one or more embodiments.
Figure 10:
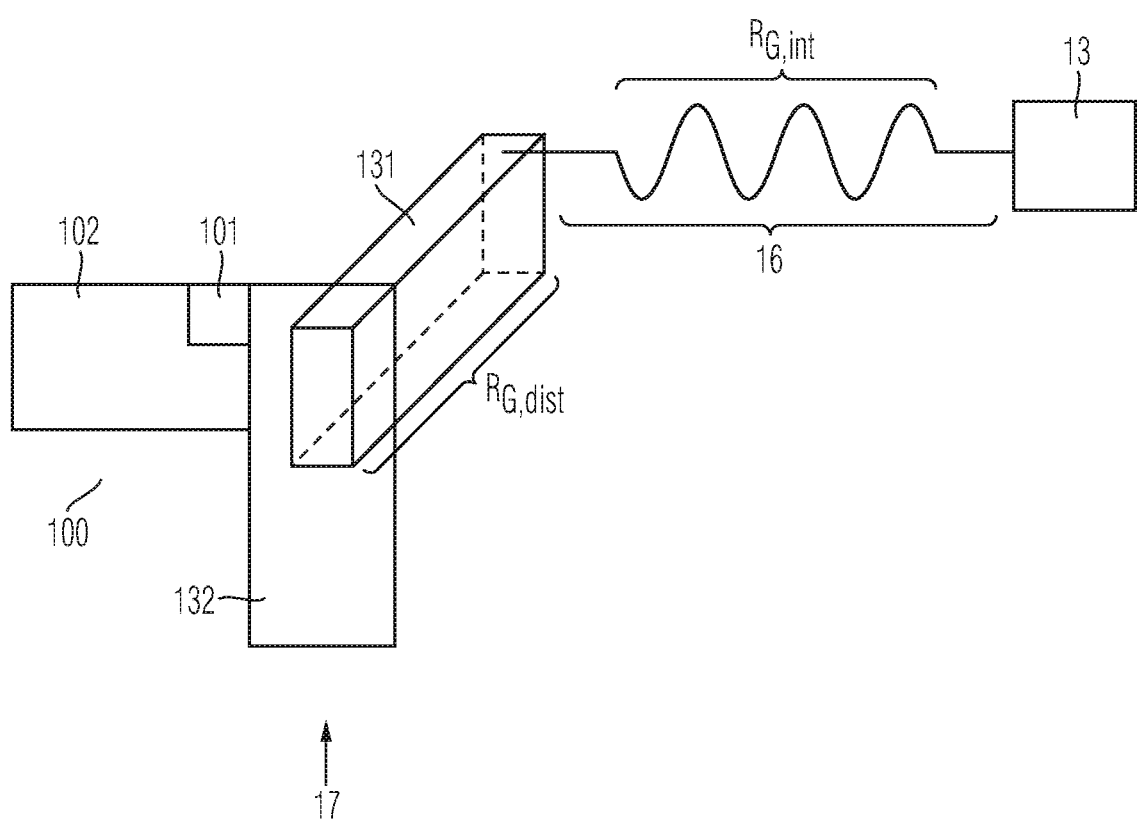
FIG. 10 schematically illustrates ohmic resistances associated with a control electrode of a power semiconductor device in accordance with one or more embodiments.
Figure 11:
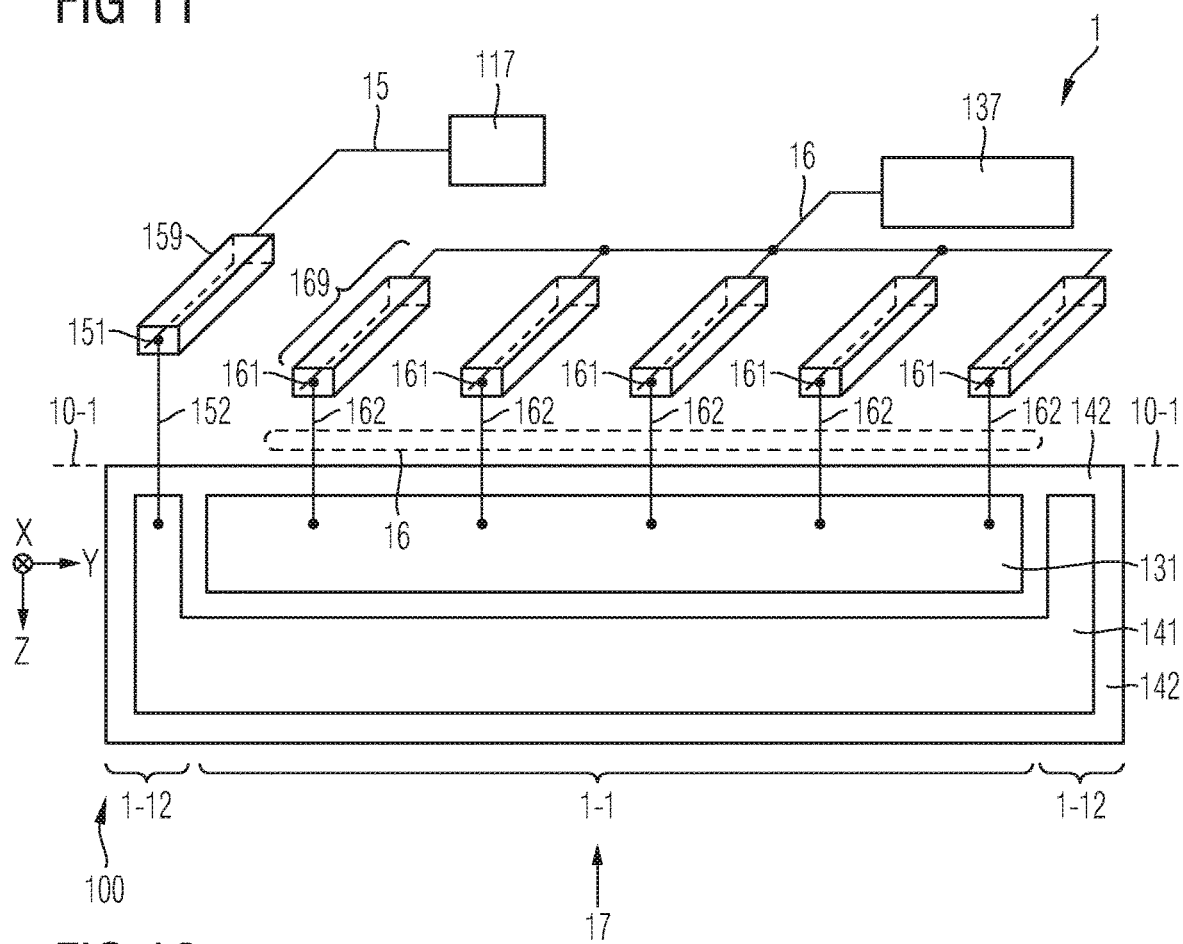
FIG. 11 schematically illustrates ohmic resistances associated with a field electrode and a control electrode of a power semiconductor device in accordance with one or more embodiments.

Each of FIGS. 9 to 11 schematically illustrate ohmic resistances associated with at least one of the field electrode 141 and the control electrode 131 of the power semiconductor device 1 in accordance with one or more embodiments.

Regarding the embodiment in accordance with FIG. 9, the semiconductor device 1 may comprise a first path 15 that electrically connects the field electrode 141 with one of the first load terminal 11 and a control terminal 13 of the semiconductor device 1.

For example, the control terminal 13 is electrically insulated from each of the first load terminal 11 and the second load terminal 12 and may be configured to receive a control signal from a driver unit 4 that may be arranged external of the semiconductor body 10. To this end, the control terminal 13 may comprise a control terminal contact pad (not illustrated in FIG. 9, cf. reference numeral 137 in FIG. 11).

For example, a series resistor 41 may be arranged between the driver unit 4 and the control terminal 13. This series resistor 41 may be arranged external of the semiconductor body 10 and it may further be designed, e.g., with regards to its actual ohmic resistance value and/or with regards to its actual position, in dependence of requirements of a given application. In an embodiment, the series resistor 41 does not contribute to the ohmic control electrode resistance $R_G$.

Downstream of the control terminal 13, e.g., downstream of the control terminal contact pad, there may be provided a second path 16 that electrically connects the one or more control electrodes 131 with the control terminal 13. In an embodiment, the second path 16 is monolithically integrated within the power semiconductor device 1, for example by means of a poly-semiconductor material isolated from the semiconductor body 10 by means of an insulator, e.g., an oxide, and, e.g., arranged above the surface 10-1 (cf. FIG. 11) of the semiconductor body 10 and/or within a trench extending into the semiconductor body 10. The second path 16 may comprise an ohmic resistor 133 and may exhibit a resistance $R_{G,int}$. For example, the ohmic resistor 133 is a resistor that has been "explicitly" arranged in the second path 16 in order to provide for a certain resistance value between the control terminal 13 and the control electrodes 131, e.g., by means of a designated area filled with, e.g., a poly-doped semiconductor material, and/or by means of a discrete resistor device. Thus, if present, the resistor 133 can be geometrically identifiable. In another embodiment, the resistor 133 is not provided. As will be explained in more detail below, the resistor 133 or, respectively, if resistor 133 is not provided, the control terminal 13 may be electrically connected to the control electrodes 131 by one or more contact runners, in accordance with an embodiment. For example, the contact runners are illustrated in FIG. 9 by means of the vertical lines that interconnect the control electrodes 131 with each other. The resistance of these contact runners may be comparatively low or even negligible. This resistance $R_{G,int}$ of the second path 16, which may thus strongly depend on the resistance of the optionally provided ohmic resistor 133, may be an internal resistance that is effective between the control terminal 13 on the one side and the control electrodes 131 and their contact runners on the other side. As explained above, the control terminal 13 may provide an interface to an area external of the semiconductor device 1, e.g., so as to allow for a connection to the driver unit 4, whereas the control electrodes 131 may be buried within the semiconductor device 1, e.g., in trenches 14 and/or 17. In an embodiment, the internal resistance $R_{G,int}$ of second path 16 does not contribute to the ohmic control electrode resistance $R_G$. Thus, for example, the optionally provided resistor 133 does not contribute to the ohmic control electrode resistance $R_G$ herein. However, the resistance of the contact runners connecting to the control electrodes 131 may contribute to the ohmic control electrode resistance $R_G$, in accordance with an embodiment.

The aspect addressed in the preceding paragraph is also schematically illustrated in FIG. 10. Accordingly, the one or more control electrodes 131, which may be buried in a respective trench 17 or 14 (the latter not being illustrated in FIG. 10), may exhibit a distributed resistance $R_{G,dist}$, which may be an internal ohmic resistance. The one or more control electrodes 131 may be electrically connected to the control terminal 13 via the second path 16. For example, the distributed resistance of the control electrode $R_{G,dist}$ is constituted substantially by that section of the control electrode 131 that controls the path of the load current, e.g., in the channel region 102, and the—even though usually negligible—resistance of said contact runners (not illustrated in FIG. 10). In contrast, the second path 16 exhibiting the internal resistance $R_{G,int}$, e.g. constituted by means of the optionally provided resistor 133, is not configured to control the path of the load current in the channel region 102, and does not contribute to the ohmic control electrode resistance $R_G$ in accordance with an embodiment.

The distributed resistance of the control electrode $R_{G,dist}$ must not necessarily be a "geometric" resistance, but can be the resistance that is measurable by means of carrying out an RC-measurement. For example, in terms of an equivalent circuit, the control electrode 131 illustrated in FIG. 10 can be a network of a plurality of unit resistors connected to each other by unit capacitances. Thus, the distributed resistance of the control electrode $R_{G,dist}$ may be the effective ohmic resistance of said equivalent circuit, wherein said equivalent circuit may comprise all the control electrodes 131 that may be present in the semiconductor device 1. Such effective ohmic resistance of the equivalent circuit may be smaller as compared to the actual geometric resistance, e.g., by a factor of ⅓. This may analogously apply to the distributed resistance of the field electrode $R_{FP,dist}$.

In an embodiment, only said distributed resistance $R_{G,dist}$ of the control electrodes 131 contributes to the ohmic control electrode resistance $R_G$. As explained above, said contact runners connecting the control electrodes 131 with each other may also contribute to the distributed resistance $R_{G,dist}$. In contrast, the optionally provided ohmic resistor 133 forming at least a part of $R_{G,int}$ does not contribute. Thus, with the definitions given above, the equation (1) may apply in accordance with one or more embodiments:

$$R_G = R_{G,dist} \tag{1}$$

According to equation (1), the ohmic control electrode resistance $R_G$ is only the distributed resistance $R_{G,dist}$ of the control electrode(s) 131 and does not include the internal resistance $R_{G,int}$ of the second path 16.

Again referring to FIG. 9, as has been explained above, the one or more field electrodes 141 may be electrically connected to the first load terminal 11 via the first path 15. It shall be understood, however, that in accordance with another embodiment, the one or more field electrodes 141 may also be electrically connected to, via the first path 15, another electrical potential, e.g., to the control terminal 13. As the control terminal 13, also the first load terminal 11 may provide an interface to an area external of the power semiconductor device 1, e.g., so as to allow for receiving and/or outputting the load current. For example, the first load terminal 11 may comprise one or more first load terminal contact pads (not illustrated in FIG. 9, cf. reference numeral 117 in FIG. 11) that is/are configured to be contacted by load current transmission means, e.g., by one or more bond wires. In contrast, the one or more field electrodes 141 may be buried within the power semiconductor device 1, e.g., they may be included in a respective trench 14 that extends into the semiconductor body 10, as has been explained above. As the control electrodes 131, also the field electrodes 141 may be electrically connected to each other by contact runners. For example, said contact runners are illustrated in FIG. 9 by means of the vertical lines that interconnect the field electrodes 141 with each other. The resistance of these contact runners may be comparatively low or even negligible.

The first path 15 may comprise an ohmic resistor 143 and may exhibit a resistance $R_{FP,int}$. For example, the ohmic resistor 143 is a resistor that has been "explicitly" arranged in the first path 15 in order to provide for a certain resistance value between the first load terminal 11 (or another terminal whose electrical potential is to be provided to the field electrodes 141) and the field electrodes 141, e.g., by means of a designated area filled with, e.g., a poly-doped semiconductor material, and/or by means of a discrete resistor device. Thus, if present, the resistor 143 can be geometrically identifiable. In another embodiment, the resistor 143 is not provided. As will be explained in more detail below, the resistor 143 or, respectively, if resistor 143 is not provided, the terminal, e.g., the first load terminal 11, may be electrically connected to the field electrodes 141 by one or more contact runners, in accordance with an embodiment. For example, as explained above, said contact runners are illustrated in FIG. 9 by means of the vertical lines that interconnect the field electrodes 141 with each other. The resistance of these contact runners may be comparatively low or even negligible. In an embodiment, the first path 15 is monolithically integrated within the power semiconductor device 1, for example by means of a poly-semiconductor material isolated from the semiconductor body 10 by means of an insulator, e.g., an oxide, and, e.g., arranged above the surface 10-1 (cf. FIG. 11) of the semiconductor body 10 and/or within a trench extending into the semiconductor body 10. This resistance $R_{FP,int}$ of the second path 16 may be an internal resistance that is effective between the first load terminal 11 (or another terminal, e.g., the control terminal 13) on the one side and the field electrodes 141 on the other side. In an embodiment, this internal resistance $R_{FP,int}$ of the first path 15 does contribute to the ohmic field electrode resistance $R_{FP}$. For example, the distributed resistance of the field electrode $R_{FP,dist}$ is constituted by that section of the field electrode 141 that is arranged in the trench 14 and by said contact runners. In contrast, the first path 15 exhibiting the internal resistance $R_{FP,int}$, e.g., constituted at least also by said resistor 143 that is optionally provided, can be arranged external of the trench 14, in accordance with an embodiment.

Thus, the one or more field electrodes 141, which may be buried in a respective trench 14, may substantially contribute to said distributed resistance $R_{FP,dist}$, which may be an internal ohmic resistance. The one or more field electrodes 141 may be electrically connected to the first load terminal 11 via the first path 15 exhibiting the internal resistance $R_{FP,int}$. Thus, with the definitions given above, the equation (2) may apply in accordance with one or more embodiments:

$$R_{FP} = R_{FP,dist} + R_{FP,int} \tag{2}$$

According to equation (2), the ohmic field electrode resistance $R_{FP}$ is equal to the sum of the internal resistance $R_{FP,int}$ of the first path 15 and the distributed resistance of the field electrode(s) $R_{FP,dist}$.

In accordance with one or more embodiments, the feature according to which the ohmic resistance $R_{FP}$ of the field electrode 141 is greater than the ohmic resistance $R_G$ of the control electrode 131 may be fulfilled, if the following equation (3) applies to the semiconductor device 1:

$$R_{FP} > R_G, \text{ wherein } R_{FP} = R_{FP,dist} + R_{FP,int} \text{ and wherein} \\ R_G = R_{G,dist} \tag{3}$$

From this, it becomes apparent that they are many possibilities of realizing the power semiconductor device 1 such that the ohmic resistance $R_{FP}$ of the field electrode 141 is greater than the ohmic resistance $R_G$ of the control electrode 131, some of which have already been explained above in some further of which shall be explained in more detail below. To begin with, the ohmic resistance REP of the field electrode 141 ($R_{FP,dist} + R_{FP,int}$) can be even greater than the sum of the internal distributed resistance $R_{G,dist}$ of the control electrode 131 and its internal resistance $R_{G,int}$, such that equation (4) applies. Equation (4) also fulfills the condition as laid out by equation (3).

$$R_{FP} = R_{FP,dist} + R_{FP,int} > R_{G,dist} + R_{G,int} \tag{4}$$

For example, the first path 15 may exhibit a meander-like structure and/or a locally decreased cross-sectional area so as to provide for a sufficiently high internal resistance $R_{FP,int}$.

In accordance with the embodiment schematically illustrated in FIG. 11, above a surface 10-1 the semiconductor body 10, there may be provided the above mentioned one or more contact runners 169, 159. In the illustrated example, the above-mentioned resistors 133 and 143 are not provided. The portions below the surface 10-1 are illustrated in a vertical cross-section along the ZY-plane, e.g., along an extension of an exemplary stripe trench (including the control electrode 131 and the field electrode 141) in the second lateral direction Y. For example, on the one side a first contact runner 159 electrically connects to a first load terminal contact pad 117, and one or more second contact runners 169 electrically connect to a control terminal contact pad 137. For example, one or more of the contact runners 169, 159 can be formed by a respective metal line, wherein such metal line may exhibit an insignificant, i.e., a negligible ohmic resistance. On the other side, the first contact runner 159 may be electrically connected to the field electrode 141, e.g., by means of a first path section 152, and the one or more second contact runners 169 may be electrically connected to the control electrode 131, e.g., by means of second path section 162.

In an embodiment, the first contact runner 159 and the first path section 151 form at least a part of the first path 15. Further, the one or more second contact runners 169 and the second path sections 162 may form at least a part of the second path 16. Further, the ohmic resistance of the first contact runners 159 may contribute to said distributed resistance $R_{FP,dist}$ of the field electrodes 141, and the ohmic resistance of the second contact runners 169 may contribute to said distributed resistance $R_{G,dist}$ of the control electrodes 131. For example, one or more of the first and second path sections 152, 162 may be realized by a respective contact plug.

In accordance with an embodiment, a number of first electrical contacts 151 established between the first path sections 152 and the first contact runner(s) 159 is lower as compared to the number of second electrical contacts 161 established between the second path sections 162 and the one or more second contact runners 169. For example, the first electrical contacts 151 are established in a transition region 1-12 between the active region 1-1 and the non-active edge region 1-2, and the second electrical contacts 161 are established in the active region 1-1, as exemplarily illustrated in FIG. 11. In another embodiment, also the second electrical contacts 161 can additionally or alternatively be established in such transition region 1-12, e.g., between active regions. Also the first contacts 151 may be established within the active region 1-1. Further, when exhibiting a stripe configuration, the control electrode 131 may be electrically connected to the one or more second contact runners 169 at several positions along the second lateral direction Y by respective second path sections 162 connected in parallel to each to other.

For example, the distributed resistance $R_{FP,dist}$ of the field electrode 141 may be substantially proportional to a lateral distance between two first contacts 151 (cf. FIG. 12), and the distributed resistance $R_{G,dist}$ of the control electrode 131 may be substantially proportional to a lateral distance between two second contacts 161. For example, in an embodiment, the control electrode 131 and the field electrode 141 may exhibit equal length related ohmic resistances, wherein equation (3) or equation (4) may be fulfilled at least also due to an uncontacted region (i.e. the region between two adjacent first contacts 151) of the field electrode 141 that exhibits a greater lateral extension as compared to an uncontacted region (i.e. the region between two adjacent second contacts 161) of the control electrode 131. This optional aspect is also schematically illustrated in FIG. 12, to which it is now referred.

Figure 12:
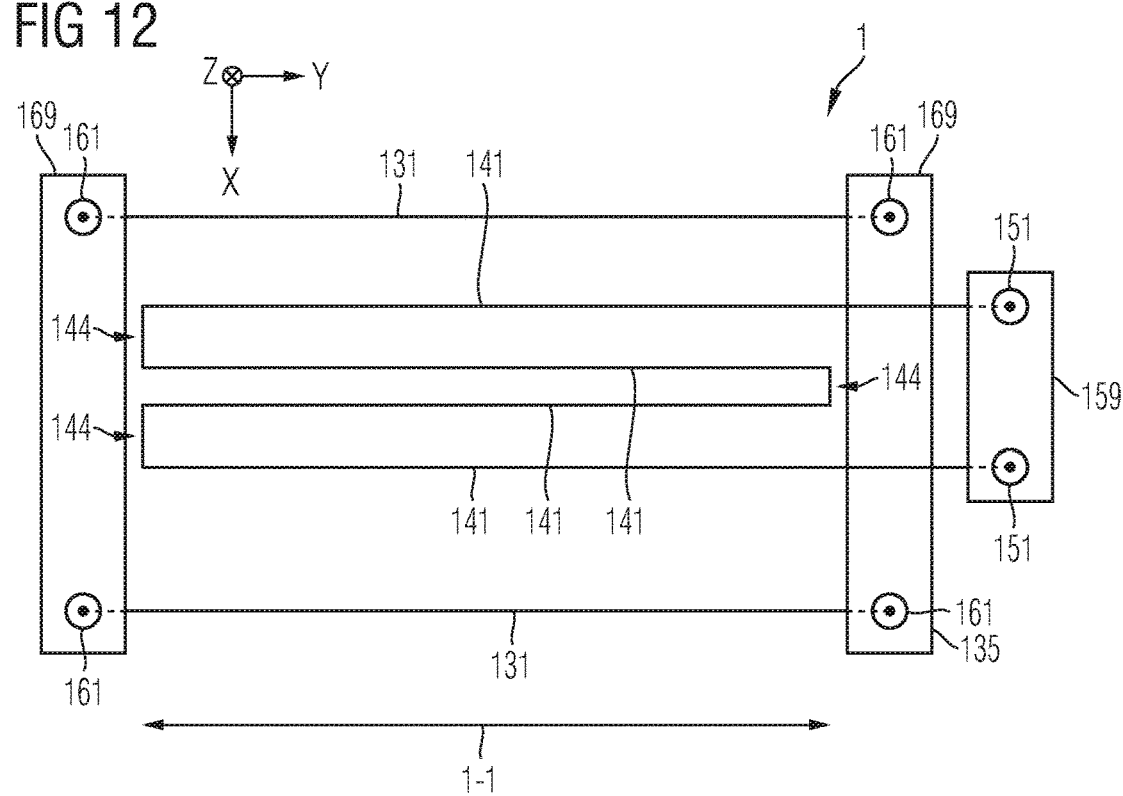
FIG. 12 schematically illustrates ohmic resistances associated with a field electrode and a control electrode of a power semiconductor device in accordance with one or more embodiments.

In accordance with the embodiment schematically illustrated in FIG. 12, each of the control electrodes 131 and the field electrodes 141 may exhibit a stripe configuration and may accordingly traverse at least a substantial part of the active region 1-1 along the second lateral direction Y. Further, as illustrated, between two control electrodes 131 that are arranged laterally adjacent to each other along the first lateral direction X, there may be arranged more than one field electrode 141, e.g., five field electrodes 141 as illustrated. For example, each of the control electrodes 131 is electrically connected to the second contact runners 169 by means of a respective second path section 162 that establish said second electrical contacts 161, e.g., at both lateral ends of a respective control electrode 131. In contrast, only a subset of the plurality of field electrodes 141 that are arranged between two control electrodes 131 is electrically connected to the first contact runners 159. In the example schematically illustrated, two of five field electrodes 141 are electrically connected to the first contact runners 159. For example, the remaining field electrodes 141 may be electrically connected to said subset of field electrodes 141, e.g., by means of first lateral sections 144. For example, the field electrodes 141 that are connected to each other by means of the lateral sections 144 may exhibit a total length of at least 0.5 mm, of at least 1 mm, or even of more than 2 mm. Accordingly, in an embodiment, along such long lateral length of the connected field electrodes 141, there is not provided a first electrical contact 151, in accordance with an embodiment. Further, the first electrical contacts 151 may be established in said transition region 1-12, as illustrated in FIG. 11. Additionally or alternatively, the first electrical contacts 151 may be established in the non-active edge region 1-2. In yet other embodiments, the first electrical contacts 151 may additionally or alternatively be established in the active region 1-1. As illustrated in FIG. 12, the first contact runner 151 may be laterally displaced from the second contact runner 169.

In the following, some further exemplary embodiments of the semiconductor device 1 will be disclosed. In each of these embodiments, the ohmic resistance $R_{FP}$ of the field electrode(s) may be greater than the ohmic resistance $R_G$ of the control electrode(s) 131, wherein such difference in ohmic resistance can be achieved in one or more of the manners that have been explained above. In at least some of the following embodiments, the distance D between the field electrode 141 and said first transition 1008 is at least 70% of the total extension TED of the drift volume 100 in the extension direction Z, as has been explained with respect to the example of FIG. 1. In other embodiments, at least one of said first thickness TX of the field insulator 142 along a first lateral direction X and the second thickness TZ of the field insulator 142 along the extension direction Z is less than the blocking voltage of the semiconductor device multiplied with a factor of 2 nm/V, as has been explained with respect to the example of FIG. 2. In yet further of the following embodiments, each of the aforementioned features regarding the distance D and the thicknesses TX and/or TY may be realized.

Figure 13:
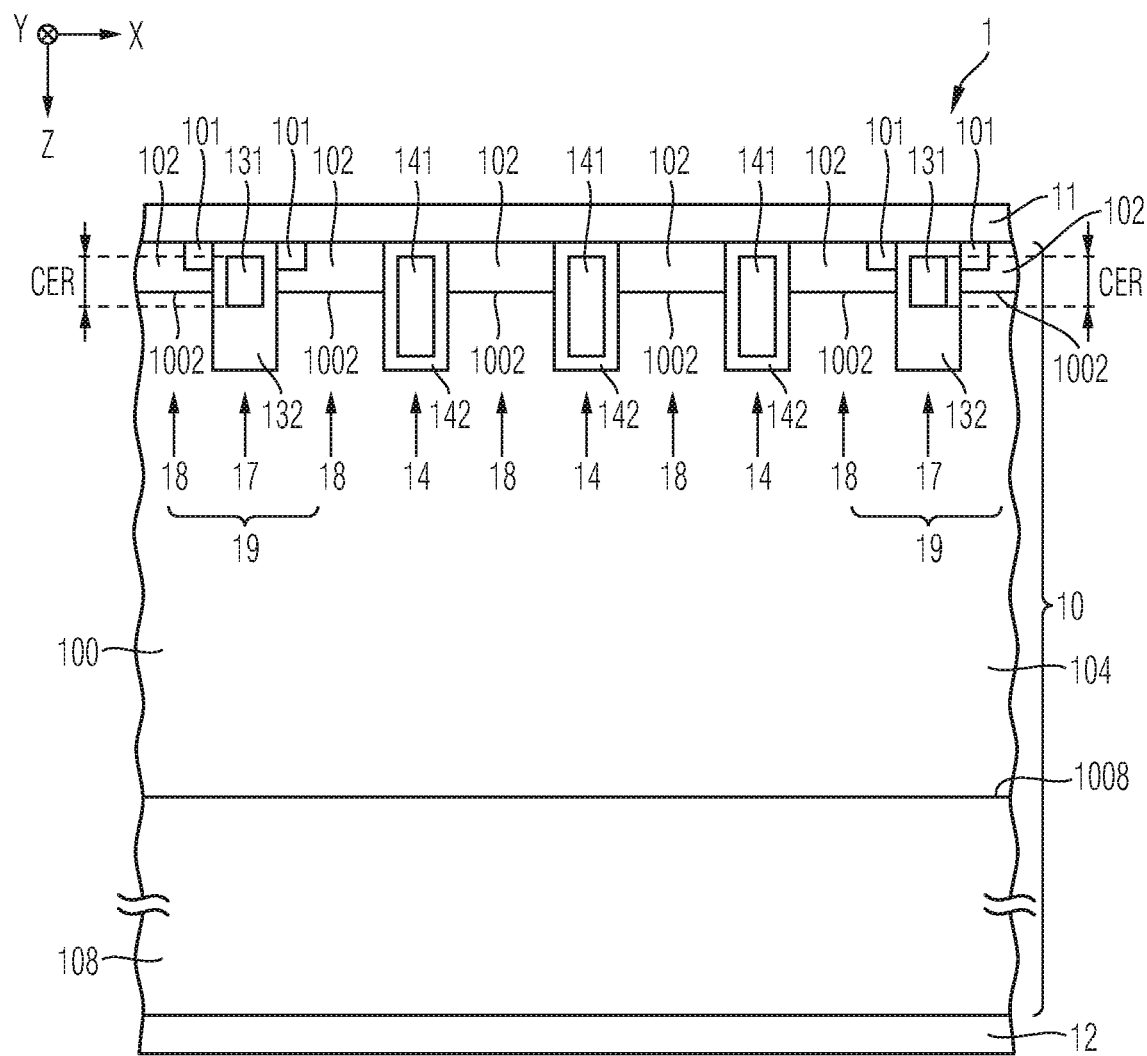
FIGS. 13-18 each schematically illustrate a section of a vertical cross-section of a power semiconductor device in accordance with one or more embodiments.

In accordance with the embodiment schematically and exemplarily illustrated in FIG. 13, in a vertical cross-section of the active region 1-1 of the power semiconductor device 1, the field electrode 141 and the control electrode 131, which may be arranged in separate trenches 14, 17, may exhibit a common extension range CER in the extension direction Z. For example, also the source region 101 and the channel region 102 and the drift volume 100 comprising the drift region 104 may each exhibit at least a section of this common extension range CER. For example, the common extension range CER is at least 200 nm, to at least 500 nm, or to at least 1 μm.

In accordance with the illustrated example, more than one field electrode 141 may be arranged in between two adjacent control electrodes 131. For example, three field electrodes 141 are arranged between the two adjacent control electrodes 131. Further, each of the field electrodes 141 and the control electrodes 131 may exhibit a stripe configuration. The field electrodes 141 may each extend further along the extension direction Z as compared to the control electrodes 131. For example, the field electrodes 141 are arranged in trenches 14, and the control electrodes 131 are arranged in other trenches 17. Even though FIG. 13 depicts the trenches 17 as only including the control electrodes 131, it shall be understood that in accordance with another embodiment, the trenches 17 including the control electrodes 131 may also include a respective field electrode 141 that may be arranged, e.g., below the control electrode 131. The trenches 14, 17 can be arranged adjacent to each other along the first lateral direction X and spatially separated from each other by a respective mesa zone 18. For example, each of the trenches 14, 17 exhibits the same total extension along the extension direction Z and have been produced in one or more shared processing steps.

Figure 14:
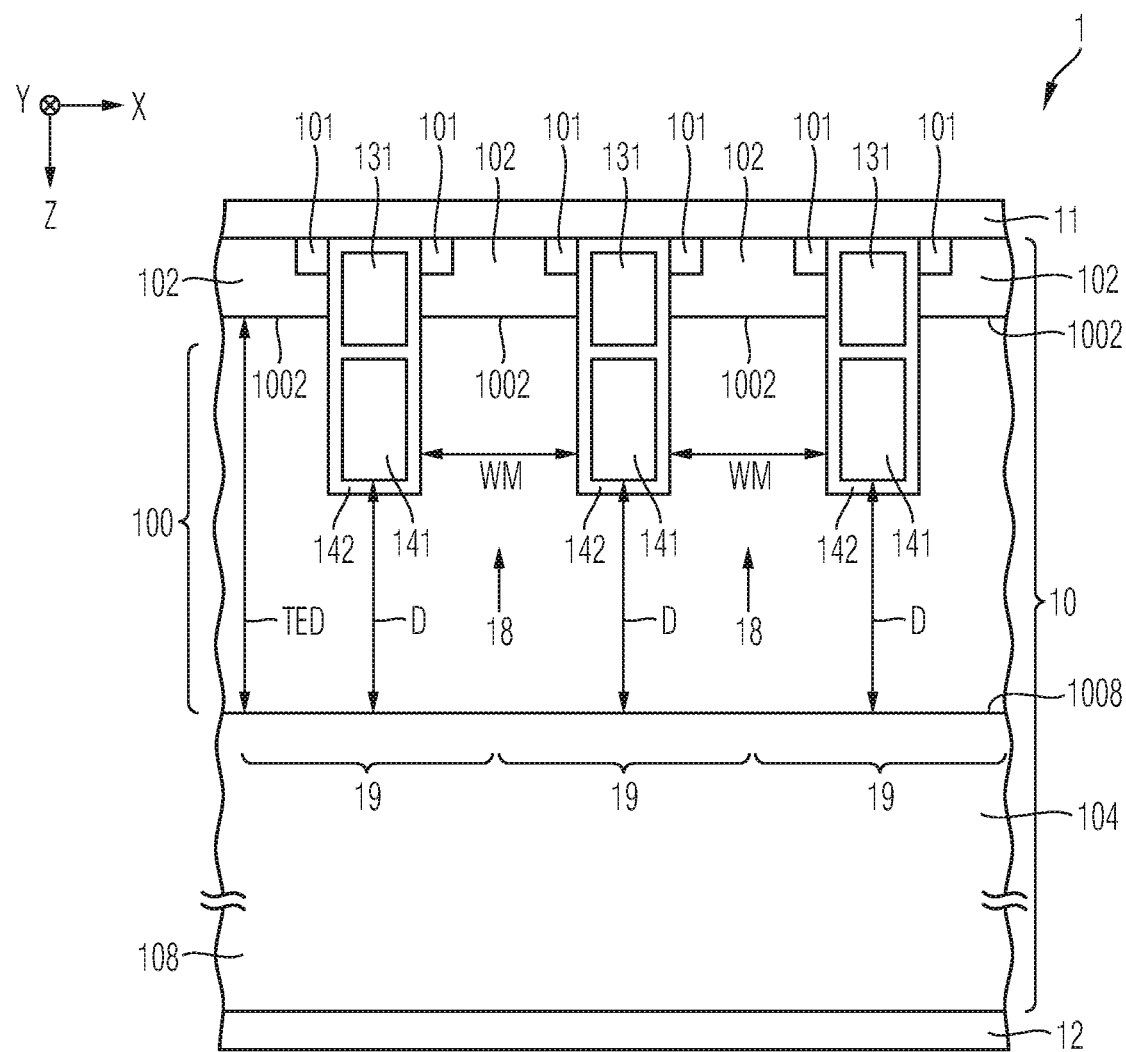

Now regarding the embodiment schematically and exemplarily illustrated in FIG. 14, the trench 14 may include each of the control electrode 131 and the field electrode 141. For example, the field electrode 141 is arranged below the control electrode 131. The semiconductor device 1 may comprise a plurality of such trenches 14 that are arranged laterally adjacent to each other along the first lateral direction X. The mesa zones 18 may each exhibit a width WM along the first lateral direction X. For example, the distance D between each field electrode 141 and the first transition 1008 is the mesa width WM multiplied with a factor of more than 2. For example, the mesa width WM is within the range of 500 nm to 5 μm, within the range of 200 nm to 10 μm, or within the range of 10 nm to 20 μm.

Further, as it becomes apparent from the schematic representation in FIG. 14, the mesa width WM may be identical to the width of the section of the channel region 102 included in the mesa 18. For example, the width of the trench 14 including the field electrode 141, i.e., the total extension of the trench 14 in the first lateral direction X, may be adjusted in relation to the mesa width WM. For example, the mesa width WM divided by said width of the trench 14 is less than 10, to less than 5, or to even less than 1.0. For example, the trench 14 may be even wider than the mesa 18, e.g., wider than the channel region 102 included therein.

Figure 15:
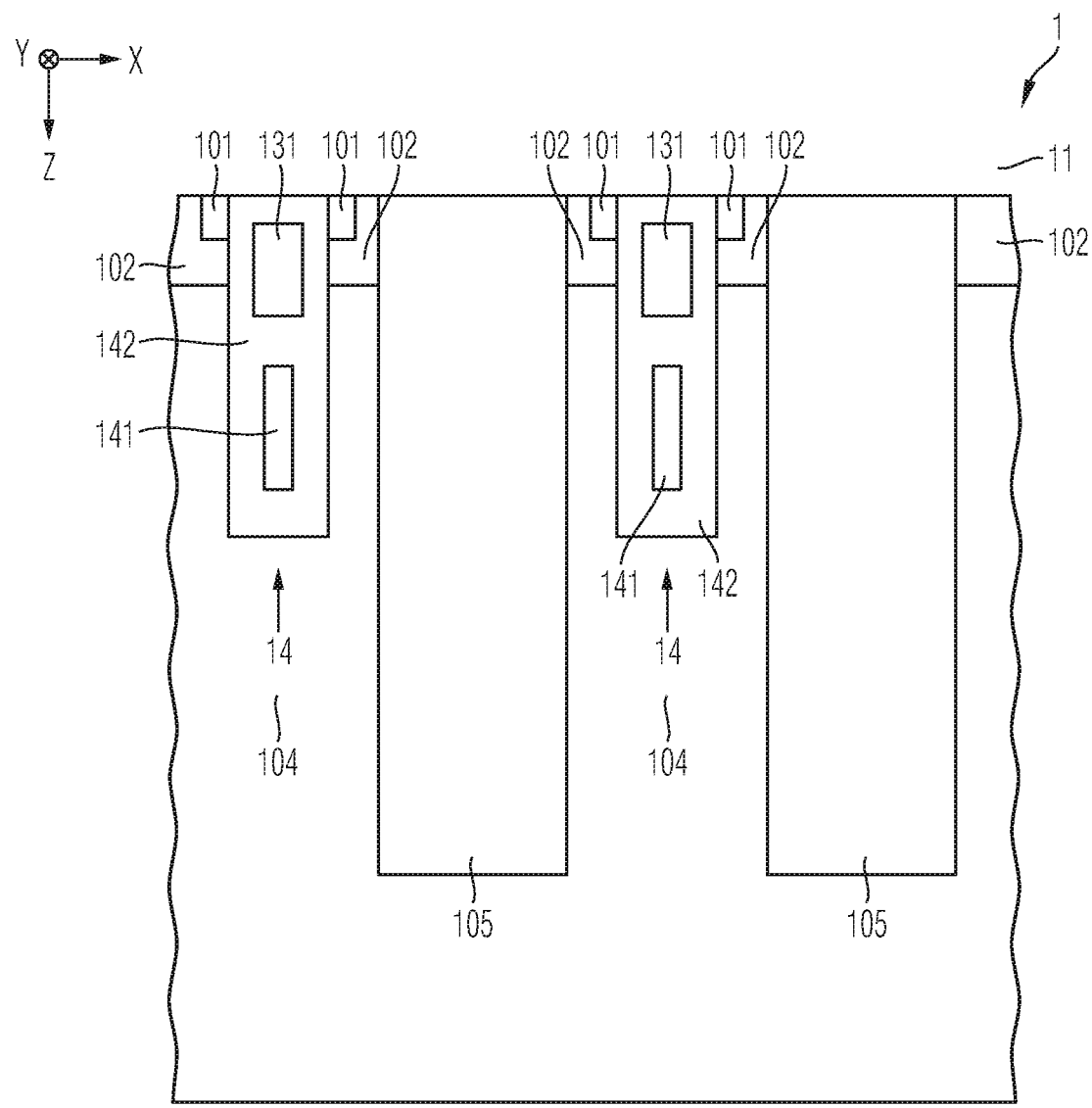

In accordance with the embodiment schematically illustrated in FIG. 15, the drift volume 100 may exhibit a superjunction structure formed by at least the drift region 104 having dopants of the first conductivity type and an adjacent compensation region 105 having dopants of a second conductivity type. Speaking generally, the skilled person is acquainted with the principles of a superjunction structure (also referred to as "compensation structure"), and within the present specification, it is not deviated from this common understanding of this notion.

The compensation region 105 may comprise dopants of the same conductivity type as the channel region 102, e.g., p-type dopants, and the compensation region 105 and the channel region 102 may constitute a contiguous semiconductor region that is doped with dopants of the second conductivity type.

For example, in accordance with the embodiment schematically illustrated in FIG. 15, each of the trenches 14 comprises both the control electrode 131 and the field electrode 141. Further, the trenches 14 extend into the drift region 104, but not into the compensation region 105, in accordance with an embodiment.

Figure 16:
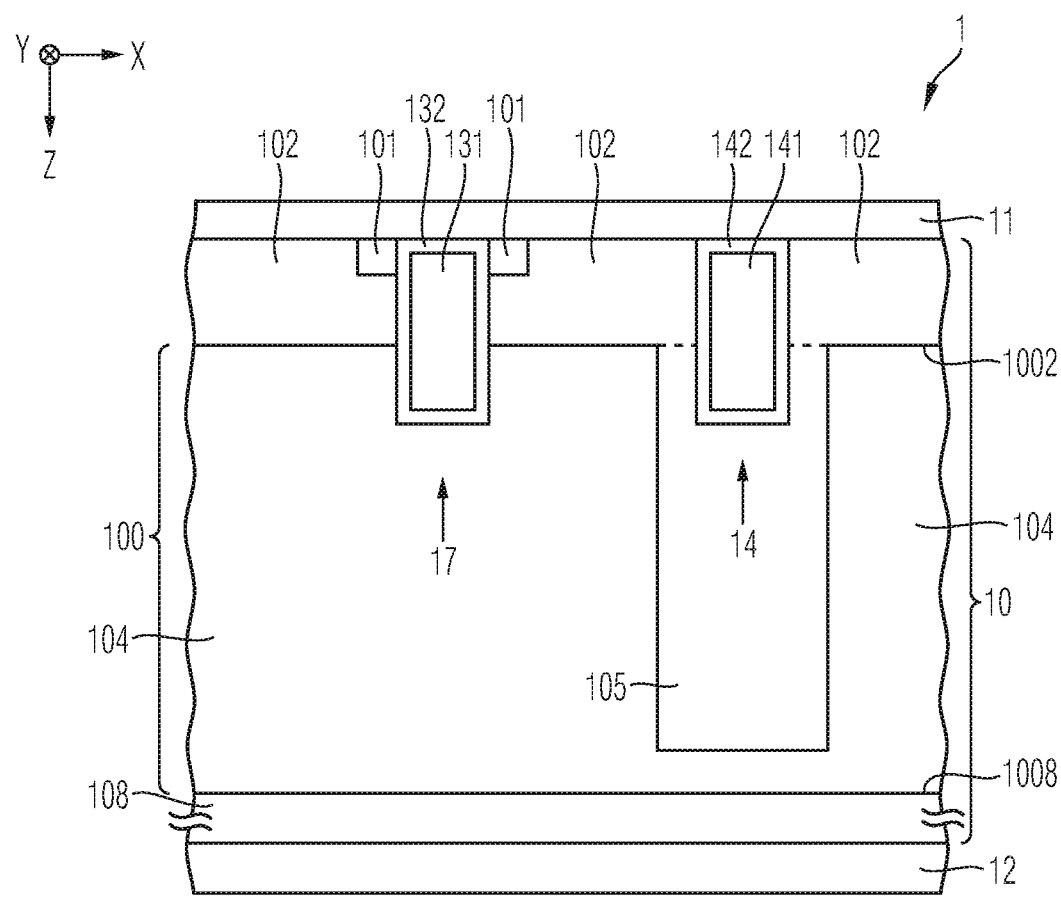

In accordance with another embodiment schematically illustrated in FIG. 16, the field electrode 141 and the control electrode 131 may be arranged in separate trenches 14, 17, wherein the trench 14 comprising the field electrode 141 may extend into the compensation region 105. For example, the compensation region 105 and the field electrode 141 may exhibit a common extension range along the extension direction Z, as illustrated in FIG. 16. In contrast, the trenches 17 including the control electrode 131 does not extend into the compensation region 105, but into the drift region 104.

Figure 17:
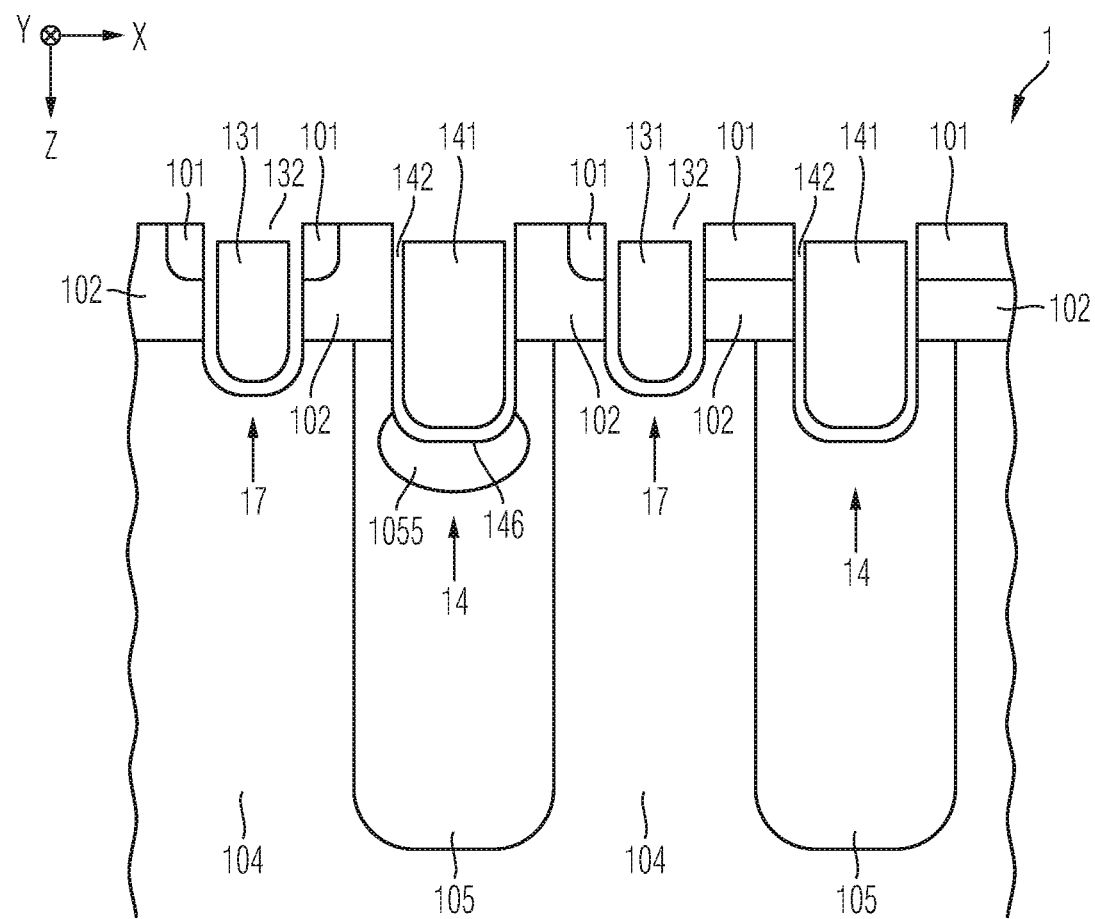

Now referring to FIG. 17, one or more or all of the trenches 14 that include the field electrode 141 may extend into the compensation region 105. Further, the field electrode 141 included therein may be electrically connected to the control terminal 13 (not illustrated in FIG. 17). Further, the compensation region 105 may exhibit a locally increased dopant concentration at an area 1055 adjacent to a trench bottom 146 of the trench 14. For example, the area 1055 is in contact with the trench bottom 146 and is only a fraction of the total cross-sectional area of the compensation region 105. For example, in the area 1055, the dopant concentration is at least twice as high as the dopant concentration in the remaining portion of the compensation region 105. This factor can be even greater than two, e.g. greater than five, greater than 10 greater than 100. In an embodiment, the area 1055 may be configured to reduce the risk of a so-called hot carrier injection.

Figure 18:
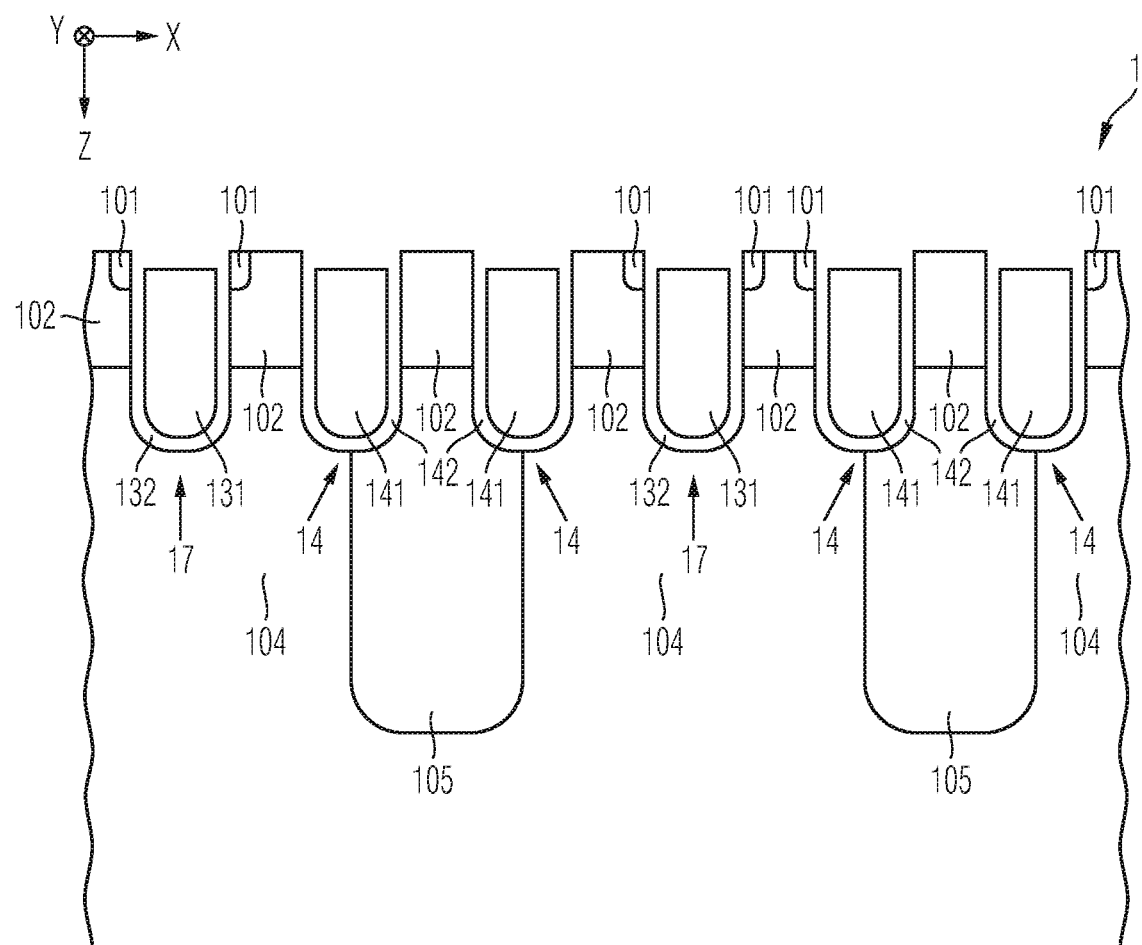

Regarding now the embodiment in accordance with FIG. 18, more than one trench 14 may extend into a respective compensation region 105. For example, at least two trenches 14 extend into one compensation region 105. Further, some of the field electrodes 141 may be electrically connected to the first load terminal 11, whereas other field electrodes 141 may instead be electrically connected to the control terminal 13. If connected to the control terminal 13, the trenches 14 may be laterally flanked by a section of the source region 101, as schematically illustrated in FIG. 18. For example, also the field electrode 141 may be configured to control a part of the load current in the channel region 102. To this end, the field electrode 141 may be configured to induce an inversion channel in the channel region 102.

Regarding all embodiments described above, the source region 101 may comprise dopants of the first conductivity type. Further, the source region 101 may be electrically connected to the first load terminal 11. The channel region 102 may comprise dopants of the second conductivity type complementary to the first conductivity type. The channel region 102 may also be electrically connected to the first load terminal 11 and may isolate the source region 101 from the drift volume 100. The drift volume 100 may comprise a drift region 104 that may comprise dopants of the first conductivity type, for example at a dopant concentration significantly lower than the dopant concentration of the source region 101. A transition between the channel region 102 and the drift volume 100 may form a pn-junction 1002.

The control electrode 131 may be operatively coupled to the channel region 102 and may be configured to induce an inversion channel in the channel region 102 so as to allow for a load current to flow in the semiconductor body 10. For example, the control electrode 131 is arranged in a trench and an insulator included in the trench 132 may be in contact with each of the source region 101, the channel region 102 in the drift volume 100.

As has already been explained above with respect to FIG. 1, the semiconductor zone 108 may be electrically connected to the second load terminal 12 and may couple the drift volume 100 to the second load terminal 12. For example, the semiconductor zone 108 is arranged in between the drift volume 100 and the second load terminal 12. For example, at least a section of the semiconductor zone 108 exhibits a dopant concentration amounting to at least 10 times of the dopant concentration of the drift volume 100. Said factor may be even higher than 10; e.g., the factor may be greater than 100, or even greater than 1000. Depending on the configuration of the power semiconductor device 1, the semiconductor zone 108 may comprise a drain region and/or an p-doped emitter (collector) region, e.g., arranged in electrical contact with the second load terminal 12. Further, in order to provide for a reverse load current capability, the semiconductor zone 108 may comprise highly doped regions, e.g., n$^+$-regions, which also referred to as "n-shorts", and which may be electrically connected to the second load terminal 12. Further, the semiconductor zone 108 may also comprise a field stop layer or a buffer layer. These exemplary and optional components of the semiconductor zone 108 have not been illustrated in the drawings.

Further, the control electrode 131 may be electrically insulated from the field electrode 141. For example, the control electrode 131 is electrically connected to the control terminal 13, as has been explained above. The field electrode 141 may be electrically connected to the first load terminal 11, for example. In other embodiments, the field electrode 141 may be electrically connected to another electrical potential. For example, the field electrode 141 is not electrically insulated from the control electrode 131 but also electrically connected to the control terminal 13.

Further, for at least some of the trenches 14 that include the field electrode 141, no source regions 102 are provided adjacent to the trenches 14 so as to ensure a high robustness, whereas in other trenches 14 that include the field electrode 141, a source region 102 is provided so as to adjust an exact capacitance value, in accordance with some embodiments. For example, in accordance with the embodiments of FIGS. 1, 2, 13, 15 and 16, no source regions are provided adjacent to the trenches 14. In accordance with the embodiments of FIGS. 17 and 18, source regions 102 are provided adjacent to at least some of the trenches 14.

In accordance with an embodiment, the total extension of the field electrode 141 along the extension direction Z may be adjusted, e.g., so as to control the capacity between the control electrode 131 and the second load terminal 12, e.g., capacity $C_{GD}$, and/or to hold away avalanches from the control electrode 131. For example, increasing the total extension of the field electrode 141 may decrease $C_{GD}$, and may support holding away the avalanches from trenches 17.

The power semiconductor device 1 described herein, e.g., in accordance with one or more of the embodiments illustrated in FIGS. 1, 2, 6, 7, and 15 to 18, can be a MOSFET, e.g., a superjunction (SJ) MOSFET.

The power semiconductor device 1 described herein, e.g., in accordance with one or more of the embodiments illustrated in FIGS. 1, 2, 6, 7, and 14, can also be an IGBT, e.g., a reverse conducting (RC) IGBT.

In the above, embodiments pertaining to power semiconductor device processing methods were explained. For example, these semiconductor devices are based on silicon (Si). Accordingly, a monocrystalline semiconductor region or layer, e.g., the region 10, 100, 101, 102, 104, 105 and 108 of exemplary embodiments, can be a monocrystalline Si-region or Si-layer. In other embodiments, polycrystalline or amorphous silicon may be employed.

It should, however, be understood that the semiconductor body 10 and components, e.g., regions 10, 100, 101, 102, 104, 105 and 108 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a semiconductor body configured to conduct a load current between a first load terminal and a second load terminal of the power semiconductor device;
a source region, a channel region and a drift volume, each included in the semiconductor body, the source region being electrically connected to the first load terminal and the channel region isolating the source region from the drift volume;
a semiconductor zone included in the semiconductor body and coupling the drift volume to the second load terminal, a first transition being established between the semiconductor zone and the drift volume;
a control electrode insulated from each of the semiconductor body and the load terminals and configured to control a path of the load current in the channel region; and
a trench extending into the drift volume along an extension direction and including a field electrode,
wherein a cross-sectional area of the field electrode is smaller than a cross-sectional area of the control electrode in a plane parallel to the extension direction,
wherein an ohmic resistance of the field electrode is greater than an ohmic resistance of the control electrode.

2. The power semiconductor device of claim 1, wherein:
the ohmic field electrode resistance is equal to the sum of an internal resistance of the first path and a distributed resistance of the field electrode; and
the ohmic control electrode resistance is only a distributed resistance of the control electrode and does not include an internal resistance constituted by an ohmic resistor provided in the second path.

3. The power semiconductor device of claim 2, wherein:
the distributed resistance of the field electrode is constituted at least by a section of the field electrode that is arranged in the trench;
and the distributed resistance of the control electrode is constituted by at least by a section of the control electrode that controls the path of the load current.

4. The power semiconductor device of claim 1, wherein the control electrode is made of a first material and wherein the field electrode is made of a second material, the second material exhibiting an electric conductivity smaller than the electric conductivity of the first material.

5. The power semiconductor device of claim 1, wherein the trench includes each of the control electrode and the field electrode.

6. The power semiconductor device of claim 1, wherein the drift volume includes a superjunction structure formed by at least a drift region having dopants of a first conductivity type and an adjacent compensation region having dopants of a second conductivity type.

7. The power semiconductor device of claim 1, wherein a distance between the field electrode and the first transition is at least 70% of the total extension of the drift volume in the extension direction.

8. The power semiconductor device of claim 1, wherein the cross-sectional area of the control electrode is the cross-sectional area of the field electrode multiplied with a factor greater than 1.1.

9. The power semiconductor device of claim 1, wherein the cross-sectional area of the control electrode is the cross-sectional area of the field electrode multiplied with a factor greater than 1.5.

10. The power semiconductor device of claim 1, wherein the cross-sectional area of the control electrode is the cross-sectional area of the field electrode multiplied with a factor greater than 2.

11. The power semiconductor device of claim 1, wherein a total extension of the field electrode is smaller than a total extension of the control electrode in the plane parallel to the extension direction.

12. The power semiconductor device of claim 11, wherein the total extension of the control electrode is the total extension of the field electrode multiplied with a factor greater than 1.1.

13. The power semiconductor device of claim 11, wherein the total extension of the control electrode is the total extension of the field electrode multiplied with a factor greater than 1.5.

14. The power semiconductor device of claim 11, wherein the total extension of the control electrode is the total extension of the field electrode multiplied with a factor greater than 2.

15. The power semiconductor device of claim 1, wherein an uncontacted region of the field electrode has a greater lateral extension than an uncontacted region of the control electrode.

16. The power semiconductor device of claim 1, wherein the field electrode extends further along the extension direction than the control electrode.

17. A switched power device configured to receive an input power signal comprising at least one of an input voltage and an input current, wherein:
the switched power device comprises a circuit arrangement including a power semiconductor device comprising: a semiconductor body configured to conduct a load current between a first load terminal and a second load terminal of the power semiconductor device; a source region, a channel region and a drift volume, each included in the semiconductor body, the source region being electrically connected to the first load terminal and the channel region isolating the source region from the drift volume; a semiconductor zone included in the semiconductor body and coupling the drift volume to the second load terminal, a first transition being established between the semiconductor zone and the drift volume; a control electrode insulated from each of the semiconductor body and the load terminals and configured to control a path of the load current in the channel region; and a trench extending into the drift volume along an extension direction and including a field electrode, wherein a cross-sectional area of the field electrode is smaller than a cross-sectional area of the control electrode in a plane parallel to the extension direction;
the circuit arrangement is configured to convert the input power signal into an output power signal comprising at least one of an output voltage and an output current, the output power signal being different from the input power signal; and
the switched power device is configured to provide the output power signal to an electric load.

18. A power semiconductor device, comprising:
a semiconductor body configured to conduct a load current between a first load terminal and a second load terminal of the power semiconductor device;

a source region, a channel region and a drift volume, each included in the semiconductor body, the source region being electrically connected to the first load terminal and the channel region isolating the source region from the drift volume;

a semiconductor zone included in the semiconductor body and coupling the drift volume to the second load terminal, a first transition being established between the semiconductor zone and the drift volume;

a control electrode insulated from each of the semiconductor body and the load terminals and configured to control a path of the load current in the channel region; and a trench extending into the drift volume along an extension direction and including a field electrode, wherein a cross-sectional area of the field electrode is smaller than a cross-sectional area of the control electrode in a plane parallel to the extension direction, wherein the control electrode is made of a first material and wherein the field electrode is made of a second material, the second material exhibiting an electric conductivity smaller than the electric conductivity of the first material.

19. A power semiconductor device, comprising:

a semiconductor body configured to conduct a load current between a first load terminal and a second load terminal of the power semiconductor device;

a source region, a channel region and a drift volume, each included in the semiconductor body, the source region being electrically connected to the first load terminal and the channel region isolating the source region from the drift volume;

a semiconductor zone included in the semiconductor body and coupling the drift volume to the second load terminal, a first transition being established between the semiconductor zone and the drift volume;

a control electrode insulated from each of the semiconductor body and the load terminals and configured to control a path of the load current in the channel region; and a trench extending into the drift volume along an extension direction and including a field electrode, wherein a cross-sectional area of the field electrode is smaller than a cross-sectional area of the control electrode in a plane parallel to the extension direction, wherein the drift volume includes a superjunction structure formed by at least a drift region having dopants of a first conductivity type and an adjacent compensation region having dopants of a second conductivity type.

20. A power semiconductor device, comprising:

a semiconductor body configured to conduct a load current between a first load terminal and a second load terminal of the power semiconductor device;

a source region, a channel region and a drift volume, each included in the semiconductor body, the source region being electrically connected to the first load terminal and the channel region isolating the source region from the drift volume;

a semiconductor zone included in the semiconductor body and coupling the drift volume to the second load terminal, a first transition being established between the semiconductor zone and the drift volume;

a control electrode insulated from each of the semiconductor body and the load terminals and configured to control a path of the load current in the channel region; and a trench extending into the drift volume along an extension direction and including a field electrode, wherein a cross-sectional area of the field electrode is smaller than a cross-sectional area of the control electrode in a plane parallel to the extension direction, wherein a distance between the field electrode and the first transition is at least 70% of the total extension of the drift volume in the extension direction.

21. A power semiconductor device, comprising:

a semiconductor body configured to conduct a load current between a first load terminal and a second load terminal of the power semiconductor device;

a source region, a channel region and a drift volume, each included in the semiconductor body, the source region being electrically connected to the first load terminal and the channel region isolating the source region from the drift volume;

a semiconductor zone included in the semiconductor body and coupling the drift volume to the second load terminal, a first transition being established between the semiconductor zone and the drift volume;

a control electrode insulated from each of the semiconductor body and the load terminals and configured to control a path of the load current in the channel region; and a trench extending into the drift volume along an extension direction and including a field electrode, wherein a cross-sectional area of the field electrode is smaller than a cross-sectional area of the control electrode in a plane parallel to the extension direction, wherein an uncontacted region of the field electrode has a greater lateral extension than an uncontacted region of the control electrode.

* * * * *